United States Patent
Kim et al.

(10) Patent No.: US 9,859,203 B2
(45) Date of Patent: Jan. 2, 2018

(54) SEMICONDUCTOR PACKAGE AND FABRICATING METHOD THEREOF

(71) Applicant: Amkor Technology, Inc., Tempe, AZ (US)

(72) Inventors: Keun Soo Kim, Yongin-si (KR); Jae Yun Kim, Namyangju-si (KR); Byoung Jun Ahn, Seongnam-si (KR); Dong Soo Ryu, Seongnam-si (KR); Dae Byoung Kang, Seoul (KR); Chel Woo Park, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/694,269

(22) Filed: Apr. 23, 2015

(65) Prior Publication Data

US 2016/0225692 A1 Aug. 4, 2016

(30) Foreign Application Priority Data

Feb. 4, 2015 (KR) .................... 10-2015-0017324

(51) Int. Cl.
*H01L 23/373* (2006.01)
*H01L 23/498* (2006.01)
(Continued)

(52) U.S. Cl.
CPC .... *H01L 23/49894* (2013.01); *H01L 23/3121* (2013.01); *H01L 23/42* (2013.01);
(Continued)

(58) Field of Classification Search
CPC ............ H01L 23/373; H01L 23/49822; H01L 23/49827; H01L 23/49894; H01L 23/3192;
(Continued)

(56) References Cited

U.S. PATENT DOCUMENTS

2008/0017968 A1\* 1/2008 Choi .................... H01L 21/565
257/686
2012/0280404 A1\* 11/2012 Kwon ................ H01L 23/3737
257/777

(Continued)

FOREIGN PATENT DOCUMENTS

KR 20080052482 A 6/2008
KR 20080076092 A 8/2008

OTHER PUBLICATIONS

Korean Office Action dated Feb. 29, 2016 for Korean Patent Application No. 10-2015-0017324.
(Continued)

*Primary Examiner* — Jessica Manno
*Assistant Examiner* — Mohammed R Alam
(74) *Attorney, Agent, or Firm* — McAndrews, Held & Malloy, Ltd.

(57) ABSTRACT

A semiconductor device structure, for example a 3D structure, and a method for fabricating a semiconductor device. As non-limiting examples, various aspects of this disclosure provide various semiconductor package structures, and methods for manufacturing thereof, that comprise interposer, interlayer, and/or heat dissipater configurations that provide for low cost, increased manufacturability, and high reliability.

18 Claims, 18 Drawing Sheets

(51) Int. Cl.
  *H01L 23/31* (2006.01)
  *H01L 25/10* (2006.01)
  *H01L 23/42* (2006.01)
  *H01L 23/433* (2006.01)
  *H01L 23/538* (2006.01)

(52) U.S. Cl.
  CPC ...... *H01L 23/433* (2013.01); *H01L 23/49811* (2013.01); *H01L 23/49816* (2013.01); *H01L 23/49827* (2013.01); *H01L 23/49833* (2013.01); *H01L 25/105* (2013.01); *H01L 23/5389* (2013.01); *H01L 2224/16227* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/92225* (2013.01); *H01L 2225/107* (2013.01); *H01L 2225/1023* (2013.01); *H01L 2225/1041* (2013.01); *H01L 2225/1058* (2013.01); *H01L 2924/1533* (2013.01); *H01L 2924/15311* (2013.01); *H01L 2924/18161* (2013.01); *H01L 2924/3511* (2013.01)

(58) Field of Classification Search
  CPC ......... H01L 23/49816; H01L 23/49811; H01L 23/5385; H01L 23/5389; H01L 25/105; H01L 23/3128; H01L 21/4853; H01L 23/36
  See application file for complete search history.

(56) References Cited

U.S. PATENT DOCUMENTS

2013/0270685 A1\* 10/2013 Yim ........................ H01L 23/10
  257/686
2015/0187743 A1\* 7/2015 Yu ........................... H01L 25/50
  257/741

OTHER PUBLICATIONS

Taiwan Search Report dated Apr. 24, 2017 for Taiwan Patent Application No. 106103673.

\* cited by examiner

SEMICONDUCTOR PACKAGE AND FABRICATING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0017324, filed on Feb. 4, 2015 in the Korean Intellectual Property Office and titled "SEMICONDUCTOR PACKAGE AND FABRICATING METHOD THEREOF," the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings.

SUMMARY

Figure 1:
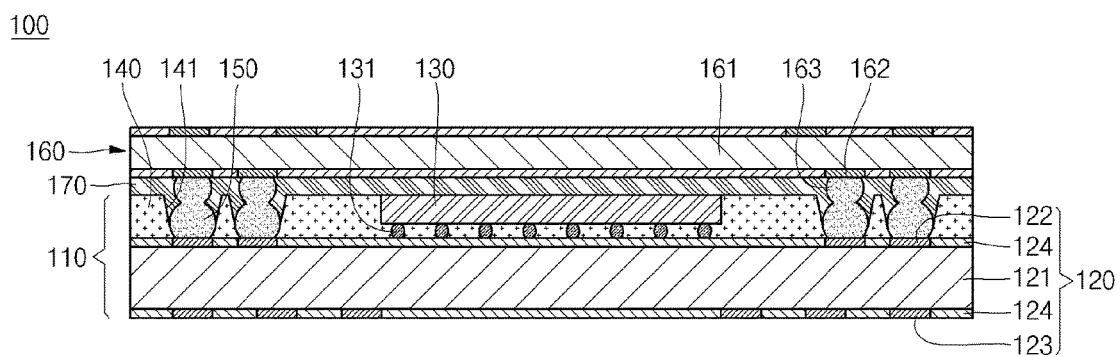
FIG. 1 is a cross-sectional view illustrating an example semiconductor package in accordance with various aspects of the present disclosure.

Various aspects of this disclosure provide a semiconductor device structure, for example a 3D structure, and a method for fabricating a semiconductor device. As non-limiting examples, various aspects of this disclosure provide various semiconductor package structures, and methods for manufacturing thereof, that comprise interposer, interlayer, and/or heat dissipater configurations that provide for low cost, increased manufacturability, and high reliability.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, and/or increase the manufacturability of the semiconductor device.

The above and other aspects of the present disclosure will be described in or be apparent from the following description of various example implementations.

According to an aspect of the present disclosure, there is provided a semiconductor package including a semiconductor device including a circuit board including an insulating layer, a first circuit pattern formed on a top surface of the insulating layer and a second circuit pattern formed on a bottom surface of the insulating layer, a semiconductor die mounted on a top surface of the circuit board, an encapsulant encapsulating the semiconductor die from an upper portion of the circuit board and having through vias exposing the first circuit pattern to the outside of the encapsulant, and conductive structures (e.g., conductive bumps or balls, pillars, wires, etc.) formed in the through vias and electrically connected to the first circuit pattern, an interposer mounted on the semiconductor device and including an insulator, a circuit pattern formed on a bottom surface of the insulator and conductive structures (e.g., conductive bumps or balls, solder balls, pillars, wires, etc.) formed on the circuit pattern, and an interlayer member interposed between the semiconductor device and the interposer, wherein the conductive structures of the interposer are electrically connected to the conductive structures in the through vias, and the interlayer member is formed to cover the conductive bumps and the solder balls.

The interlayer member may, for example, be formed of an epoxy flux, an epoxy resin, an epoxy molding compound (EMC), an anisotropically conductive paste (ACP), etc.

In addition, the interlayer member may include a first interlayer member part covering the conductive bumps and the solder balls and a second interlayer member part formed along an outer peripheral edge of the first interlayer member part.

The first interlayer member part may, for example, be formed of an epoxy flux and the second interlayer member part may, for example, be formed of an adhesive.

The second interlayer member part may, for example, be formed between the semiconductor die and the interposer and between the encapsulant and the interposer.

According to an aspect of the present disclosure, there is provided a fabricating method of a semiconductor package, including preparing a semiconductor device including a circuit board including an insulating layer, a first circuit pattern formed on a top surface of the insulating layer and a second circuit pattern formed on a bottom surface of the insulating layer, a semiconductor die mounted on a top surface of the circuit board, an encapsulant encapsulating the semiconductor die and having through vias exposing the first circuit pattern to the outside of the encapsulant, and conductive structures (e.g., conductive bumps or balls, pillars, wires, etc.) formed in the through vias and electrically connected to the first circuit pattern, forming an interlayer member on the semiconductor device, and positioning an interposer on the interlayer member and performing a reflow process on the interlayer member, the interposer including an insulator, a circuit pattern formed on a bottom surface of the insulator and conductive structures (e.g., conductive bumps or balls, solder balls, pillars, wires, etc.) formed on the circuit pattern.

In the performing of the reflow process, the conductive structures in the through vias may be welded to the conductive structures of the interposer.

In addition, in the performing of the reflow process, the interlayer member may be cured between the semiconductor device and the interposer.

The interlayer member may cover lateral surfaces of any or all of the conductive structures.

In the forming of the interlayer member, the interlayer member may be coated to entirely cover a top portion of the semiconductor device.

The interlayer member may, for example, be formed of an epoxy flux, an epoxy resin, an epoxy molding compound (EMC), an anisotropically conductive paste (ACP), etc.

In the forming of the interlayer member, a first interlayer member part may be formed on the through vias and a second interlayer member part may be formed on the semiconductor die and the encapsulant.

The first interlayer member part may, for example, be formed of an epoxy flux and the second interlayer member part may, for example, be formed of an adhesive.

According to still another aspect of the present disclosure, there is provided a fabricating method of a semiconductor package, including preparing a semiconductor device including a circuit board including an insulating layer, a first circuit pattern formed on a top surface of the insulating layer and a second circuit pattern formed on a bottom surface of the insulating layer, a semiconductor die mounted on a top surface of the circuit board, an encapsulant encapsulating the semiconductor die from an upper portion of the circuit board and having through vias exposing the first circuit pattern to the outside, and conductive structures (e.g., conductive bumps or balls, pillars, wires, etc.) formed in the through vias and electrically connected to the first circuit pattern, forming a first interlayer member part on the semiconductor device by coating, positioning an interposer on the interlayer member and performing a reflow process on the interposer, the interposer including an insulator, a circuit pattern formed on a bottom surface of the insulator and conductive structures (e.g., conductive bumps or balls, solder balls, pillars, wires, etc.) formed on the circuit pattern, and forming a second interlayer member part between the semiconductor device and the interposer by, for example, injection-molding.

In the forming of the first interlayer member part, the first interlayer member part may be coated on the through vias.

In addition, in the performing of the reflow process, the conductive structures in the through vias may be welded to the conductive structures of the interposer and the first interlayer member part may cover lateral surfaces of any or all of the conductive structures.

In the forming of the second interlayer member part, the second interlayer member part may, for example, be injected into portions between the semiconductor die and the interposer and between the encapsulant and the interposer.

In the forming of the first interlayer member part, the first interlayer member part may, for example, be formed on the solder balls by dipping.

According to yet another aspect of the present disclosure, there is provided a semiconductor package including a circuit board including an insulating layer, a first circuit pattern formed on a top surface of the insulating layer and a second circuit pattern formed on a bottom surface of the insulating layer, a semiconductor die mounted on the circuit board, an interposer mounted on the circuit board and the semiconductor die and including an insulator, a circuit pattern formed on a bottom surface of the insulator and a conductive filler formed on the circuit pattern, and an interlayer member interposed between the circuit board and the interposer, wherein the conductive filler is electrically connected to the first circuit pattern and the interlayer member is formed to cover lateral surfaces of the conductive filler.

The interlayer member may, for example, be formed of an epoxy flux, an epoxy resin, an epoxy molding compound (EMC), an anisotropically conductive paste (ACP), etc.

In addition, the interlayer member may, for example, include a first interlayer member part covering the conductive filler, the first circuit pattern of the circuit board electrically connected to the conductive filler and the circuit pattern of the interposer and a second interlayer member part formed along an outer peripheral edge of the first interlayer member part.

The first interlayer member part may, for example, be formed of an epoxy flux and the second interlayer member part is formed of an adhesive.

The second interlayer member part may, for example, be formed between the semiconductor die and the interposer and between the encapsulant and the interposer.

In addition, the second interlayer member part may, for example, be formed between the semiconductor die and the interposer.

According to a still further aspect of the present disclosure, there is provided a fabricating method of a semiconductor package, including attaching a semiconductor die on a circuit board including an insulating layer, a first circuit pattern formed on a top surface of the insulating layer and a second circuit pattern formed on a bottom surface of the insulating layer, forming an interlayer member on the circuit board and the semiconductor die, for example by coating, and positioning an interposer on the interlayer member and performing a reflow process on the interlayer member, the interposer including an insulator, a circuit pattern formed on a bottom surface of the insulator and a conductive filler formed on the circuit pattern.

In the performing of the reflow process, the conductive filler may be electrically connected to the first circuit pattern of the circuit board.

In addition, in the performing of the reflow process, the interlayer member may, for example, be cured between the circuit board and the interposer.

The interlayer member may, for example, cover the conductive filler, the first circuit pattern of the circuit board electrically connected to the conductive filler and the circuit pattern of the interposer.

In addition, the interlayer member may, for example, be formed of an epoxy flux, an epoxy resin, an epoxy molding compound (EMC), an anisotropically conductive paste (ACP), etc.

In the forming of the interlayer member, a first interlayer member part may, for example, be formed on the first circuit pattern and a second interlayer member part may, for example, be formed on the semiconductor die.

The first interlayer member part may, for example, be formed of an epoxy flux and the second interlayer member part may, for example, be formed of an adhesive.

According to still further aspect of the present disclosure, there is provided a fabricating method of a semiconductor package, including attaching a semiconductor die on a circuit board including an insulating layer, a first circuit pattern formed on a top surface of the insulating layer and a second circuit pattern formed on a bottom surface of the insulating layer, forming a first interlayer member part on the circuit board, for example by coating, positioning an interposer on the interlayer member and performing a reflow process on the interlayer member, the interposer including an insulator, a circuit pattern formed on a bottom surface of the insulator and a conductive filler formed on the circuit pattern, and forming a second interlayer member part between the circuit board and the interposer, for example by injection-molding.

In the forming of the first interlayer member part, the first interlayer member part may, for example, be coated on the first circuit pattern of the circuit board.

In the performing of the reflow process, the conductive filler may, for example, be electrically connected to the first circuit pattern and the first interlayer member part may, for example, cover the conductive filler, the first circuit pattern of the circuit board electrically connected to the conductive filler and the circuit pattern of the interposer.

In the forming of the second interlayer member part, the second interlayer member part may, for example, be injected into portions between the semiconductor die and the interposer and between the circuit board and the interposer.

According to a still further aspect of the present disclosure, there is provided a semiconductor package including a semiconductor device including a circuit board including an insulating layer, a first circuit pattern formed on a top surface of the insulating layer and a second circuit pattern formed on a bottom surface of the insulating layer, a semiconductor die mounted on a top surface of the circuit board and having a metal layer formed thereon, an encapsulant encapsulating the semiconductor die from an upper portion of the circuit board and having through vias exposing the first circuit pattern to the outside, and conductive structures (e.g., conductive bumps or balls, pillars, wires, etc.) formed in the through vias and electrically connected to the first circuit pattern, an interposer mounted on the semiconductor device and including an insulator, a circuit pattern formed on a bottom surface of the insulator and conductive structures (e.g., conductive bumps or balls, solder balls, pillars, wires, etc.) formed on the circuit pattern, and a heat radiating member disposed between the semiconductor die and the interposer, where the heat radiating member is electrically (or at least heat-conductively) connected to the metal layer and the interposer (e.g., a conductive pad formed thereon).

The heat radiating member may, for example, be formed of a solder paste (e.g., at least initially, prior to a reflow process if performed).

The semiconductor package may, for example, further include an interlayer member between the semiconductor device and the interposer.

The interlayer member may, for example, be formed between the encapsulant and the interposer.

According to still another aspect of the present disclosure, there is provided a semiconductor package including an interposer including an insulator, a circuit pattern and conductive pads formed on a top surface of the insulator and conductive structures (e.g., conductive bumps or balls, solder balls, pillars, wires, etc.) formed on the circuit pattern, a semiconductor device mounted on the interposer and including a circuit board including an insulating layer, a first circuit pattern formed on a bottom surface of the insulating layer and a second circuit pattern formed on a top surface of the insulating layer, a semiconductor die mounted on a bottom surface of the circuit board and having a metal layer formed on its bottom surface, an encapsulant encapsulating the semiconductor die from a lower portion of the circuit board and having through vias exposing the first circuit pattern to the outside, and conductive structures (e.g., conductive bumps or balls, pillars, wires, etc.) formed in the through vias and electrically connected to the first circuit pattern, and a heat radiating member between the interposer and the semiconductor die, wherein the heat radiating member is electrically connected to the metal layer and the conductive pad.

The heat radiating member may, for example, be formed of a solder paste (e.g., at least initially, prior to a reflow process if performed).

According to still another aspect of the present disclosure, there is provided a fabricating method of a semiconductor package, including preparing a semiconductor device including a circuit board including an insulating layer, a first circuit pattern formed on a top surface of the insulating layer and a second circuit pattern formed on a bottom surface of the insulating layer, a semiconductor die mounted on a top surface of the circuit board and having a metal layer formed thereon, an encapsulant encapsulating the semiconductor die from an upper portion of the circuit board and having through vias exposing the first circuit pattern to the outside of the encapsulant, and conductive structures (e.g., conductive bumps or balls, pillars, wires, etc.) formed in the through vias and electrically connected to the first circuit pattern, forming a heat radiating member on the semiconductor die, for example by coating, and positioning an interposer on the heat radiating member and performing a reflow process on the interposer, the interposer including an insulator, a circuit pattern and conductive pads formed on a bottom surface of the insulator and conductive structures (e.g., conductive bumps or balls, solder balls, pillars, wires, etc.) formed on the circuit pattern.

In the forming of the heat radiating member, the heat radiating member may, for example, be coated on the metal layer of the semiconductor die.

In the performing of the reflow process, the conductive structures in the through vias may, for example, be welded to the conductive structures attached to the interposer, and the heat radiating member may be electrically connected to the metal layer and the conductive pad.

The heat radiating member may, for example, be formed of a solder paste (e.g., at least initially, prior to a reflow process if performed).

After the performing of the reflow process, the fabricating method may, for example, further include forming an interlayer member between the semiconductor device and the interposer by, for example, injection-molding.

According to still another aspect of the present disclosure, there is provided a fabricating method of a semiconductor package, including preparing an interposer including an insulator, a circuit pattern and a conductive pad formed on a top surface of the insulator and conductive structures (e.g., conductive bumps or balls, solder balls, pillars, wires, etc.) formed on the circuit pattern, forming a heat radiating member on the interposer, for example by coating, and positioning a semiconductor device and performing a reflow process on the semiconductor device, the semiconductor device including a circuit board including an insulating layer formed on the heat radiating member, a first circuit pattern formed on a bottom surface of the insulating layer and a second circuit pattern formed on a top surface of the insulating layer, a semiconductor die mounted on a bottom surface of the circuit board and having a metal layer formed on its bottom surface, an encapsulant encapsulating the semiconductor die from a bottom portion of the circuit board and having through vias exposing the first circuit pattern to the outside, and conductive structures (e.g., conductive bumps or balls, pillars, wires, etc.) formed in the through vias and electrically connected to the first circuit pattern.

In the forming of the heat radiating member, the heat radiating member may, for example, be coated on conductive pads of the interposer.

In the performing of the reflow process, the conductive structures in the through vias may be welded to the conductive structures attached to the interposer, and the heat radiating member may be electrically connected to the metal layer and the conductive pad.

The heat radiating member may, for example, be formed of a solder paste (e.g., at least initially, prior to a reflow process if performed).

As described above, in the semiconductor package according to an example of the present disclosure, since the interlayer member made of an epoxy flux is formed between the semiconductor device and the interposer, bondability between the semiconductor device and the interposer is increased, thereby improving the reliability and reducing warpage.

In addition, in a semiconductor package according to various aspects of the present disclosure, since the heat radiating member made of a solder paste is formed between the semiconductor device and the interposer, heat generated from the semiconductor device can be efficiently radiated to the outside through the interposer.

Example aspects of the present disclosure will now be presented with reference to accompanying drawings, such that those skilled in the art may readily practice the various aspects.

Referring to FIG. 1, the semiconductor package 100 according to an example of the present disclosure includes a semiconductor device 110, an interposer 160 and an interlayer member 170. Note that the example semiconductor package 100 may share any or all characteristics with any one or more other semiconductor packages discussed herein.

The semiconductor device 110 includes a circuit board 120, a semiconductor die 130, an encapsulant 140 and conductive structures 150 (e.g., conductive bumps or balls, pillars, wires, etc.). The semiconductor device 110 may, for example, be called a through mold via (TMV) semiconductor device.

The circuit board 120 includes an insulating layer 121 having planar top and bottom surfaces, a first circuit pattern 122 formed on a top surface of the insulating layer 121, a second circuit pattern 123 formed on a bottom surface of the insulating layer 121, and a passivation layer 124 formed along outer peripheral edges of the first and second circuit patterns 122 and 123 to a predetermined thickness. The circuit board 120 may, for example, be a printed circuit board (PCB) having opposite surfaces. Here, conductive structures (e.g., conductive bumps or balls, solder balls, pillars, wires, etc.) (not shown) are welded plated or otherwise attached to the second circuit pattern 123 to then be electrically connected to an external circuit.

The semiconductor die 130 is mounted on the circuit board 120. The semiconductor die 130 may, for example, be generally made of a silicon material and have a plurality of semiconductor devices formed therein. In addition, a plurality of conductive structures 131 (e.g., conductive bumps or balls, solder balls, pillars, wires, etc.) may be formed under the semiconductor die 130. The semiconductor die 130 is electrically connected to the circuit board 120 through the conductive structures 131. The conductive structures 131 may be electrically connected to the first circuit pattern 122 of the circuit board 120.

The encapsulant 140 encapsulates the semiconductor die 130 from an upper portion of the circuit board 120. The encapsulant 140 may, for example, expose a top portion of the semiconductor die 130 to the outside of the encapsulant 140. In addition, through vias 141 may be formed in the encapsulant 140. The through vias 141 may, for example, be formed over the first circuit pattern 122 of the circuit board 120 and expose the first circuit pattern 122 to the outside of the encapsulant 140.

The conductive structures 150 (e.g., conductive bumps or balls, pillars, wires, etc.) may be formed on the first circuit pattern 122 exposed to the outside of the encapsulant 140 by the through vias 141. The conductive structures 150 may, for example, be electrically connected to the semiconductor die 130 through the first circuit pattern 122. The conductive structures 150 may, for example, include tin/lead, leadless tin, equivalents thereof, etc., but aspects of the present disclosure are not limited thereto.

The interposer 160 is mounted on the semiconductor device 110. The interposer 160 includes an insulator 161 having planar top and bottom surfaces, a circuit pattern 162 formed on a bottom surface of the insulator 161 and conductive structures 163 (e.g., conductive bumps or balls, pillars, wires, etc.) formed on the circuit pattern 162. In addition, the interposer 160 may also include a circuit pattern formed on a top surface of the insulator 161 so as to stack semiconductor devices, such as for example memory chips or logic chips, thereon. The solder balls 163 are electrically connected to the conductive bumps 150 of the semiconductor device 110. For example, when the interposer 160 is mounted on the semiconductor device 110, the solder balls 163 are welded to the conductive bumps 150 to electrically connect the interposer 160 and the semiconductor device 110 to each other. The interposer 160 may, for example, be a silicon substrate, a printed circuit board (PCB), etc.

The interlayer member 170 may be formed between the semiconductor device 110 and the interposer 160. For example, the interlayer member 170 may be interposed between a top surface of the semiconductor die 130 mounted on the circuit board 120 and a bottom surface of the interposer 160. In addition, the interlayer member 170 may be formed to cover lateral surfaces of the conductive bumps 150 of the semiconductor device 110 and the solder balls 163 of the interposer 160.

The interlayer member 170 may, for example, be formed of an epoxy flux. The epoxy flux may, for example, be applied to surrounding areas of the conductive bumps 150 and the solder balls 163, thereby improving adhesion between the conductive bumps 150 and the solder balls 163 and allowing the heat generated from the semiconductor die 130 to be transferred to the interposer 160 to then be transferred (e.g., radiated, conducted, convected, etc.) to the outside. Accordingly, cooling efficiency of the semiconductor package 100 according to various aspects of the present disclosure may be improved. For example, the interlayer member 170 may tightly couple the semiconductor device 110 to the interposer 160. In addition, the interlayer member 170 may reduce warpage occurring between the semiconductor device 110 and the interposer 160.

In addition, the interlayer member 170 may, for example, be formed by injecting an epoxy resin or an epoxy molding compound (EMC) into a region between the semiconductor device 110 and the interposer 160. Further for example, the interlayer member 170 may also be formed of an anisotropically conductive paste (ACP). The anisotropically conductive paste (ACP) includes a binder and a conductive filler mixed therein and is used to mechanically and electrically connect upper and lower electrodes coupled to each other, for example by thermal compression. In addition, since the binder functions as an insulator, an insulating property is maintained between conductive fillers existing in adjacent circuits.

Figure 2:
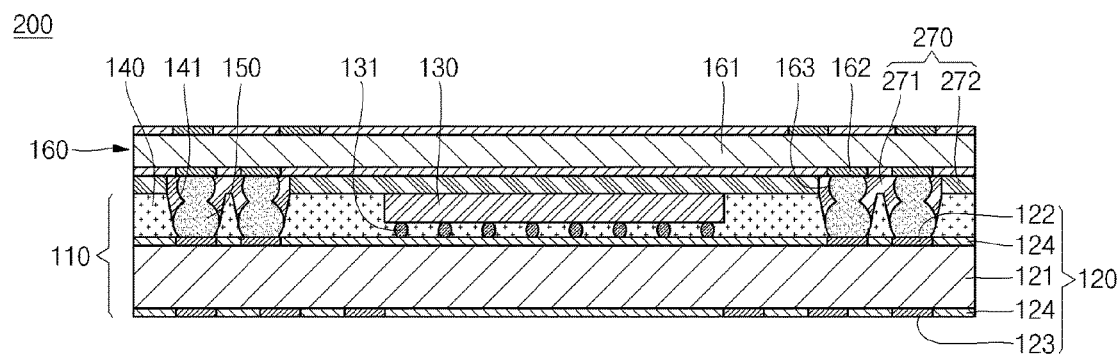
FIG. 2 is a cross-sectional view illustrating an example semiconductor package in accordance with various aspects of the present disclosure.

FIG. 2 is a cross-sectional view illustrating an example semiconductor package in accordance with various aspects of the present disclosure.

Referring to FIG. 2, the semiconductor package 200 according to another example of the present disclosure includes a semiconductor device 110, an interposer 160 and an interlayer member 270. The semiconductor package 200 shown in FIG. 2 is substantially the same as the semiconductor package 100 shown in FIG. 1, and the following description will generally focus on differences therebetween. Note that the example semiconductor package 200 may share any or all characteristics with any one or more other semiconductor packages discussed herein.

The interlayer member 270 is formed between the semiconductor device 110 and the interposer 160. The interlayer member 270 may, for example, include a first interlayer member part 271 covering lateral surfaces of the conductive structures 150 and the conductive structures 163 and a second interlayer member part 272 formed at an outer peripheral edge of the first interlayer member part 271. For example, the second interlayer member part 272 may encapsulate the first interlayer member part 271. Also for example, the second interlayer member part 272 may be formed outside of a region generally defined by a plurality of first interlayer member parts 271, inside of a region generally defined by a plurality of first interlayer member parts 271, and/or between first interlayer member parts 271. Though shown in FIG. 2 as contacting the first interlayer member part 271, the second interlayer member part 272 may be separated from the first interlayer member part 271 by a gap (e.g., an air gap or gap filled with another material).

The first interlayer member part 271 is formed in the vicinity of areas where the conductive bumps 150 of the semiconductor device 110 are welded or otherwise attached to the conductive structures 163 attached to the interposer 160. Here, the first interlayer member part 271 may be formed to fill the through vias 141 of the semiconductor device 110 (e.g., in regions not already occupied by conductive structure). In addition, the first interlayer member part 271 may, for example, be formed of an epoxy flux and cover the surrounding areas of the conductive structures 150 and the conductive structures 163. Therefore, the first interlayer member part 271 may improve adhesion between the conductive structures 150 and the conductive structures 163.

The second interlayer member part 272 may, for example, be formed along the outer peripheral edge of the first interlayer member part 271. For example, the second interlayer member part 272 may be formed between the semiconductor device 110 and the interposer 160, where the conductive structures 150 are not welded to the conductive structures 163. For example, the second interlayer member part 272 is formed between the semiconductor die 130 and the interposer 160 and between the encapsulant 140 and the interposer 160. The second interlayer member part 272 may, for example, be formed of a general adhesive, such as an epoxy resin or EMC, or of other materials. The second interlayer member part 272 may, for example, transfer the heat generated from the semiconductor die 130 to the interposer 160 to then be transferred (e.g., radiated, conducted, convected, etc.) to the outside. In addition, the second interlayer member part 272 may improve bondability between the semiconductor device 110 and the interposer 160.

FIGS. 3A to 3D are cross-sectional views illustrating an example method of fabricating a semiconductor package, in accordance with various aspects of the present disclosure.

The method of fabricating (or manufacturing) a semiconductor package according to an example of the present disclosure includes preparing a semiconductor device, forming an interlayer member and performing a reflow process. Hereinafter, the method of fabricating a semiconductor package according to an example of the present disclosure will be described in detail with reference to FIGS. 3A to 3D. Note that the example method may share any or all characteristics with any one or more other methods discussed herein.

Figure 3A:
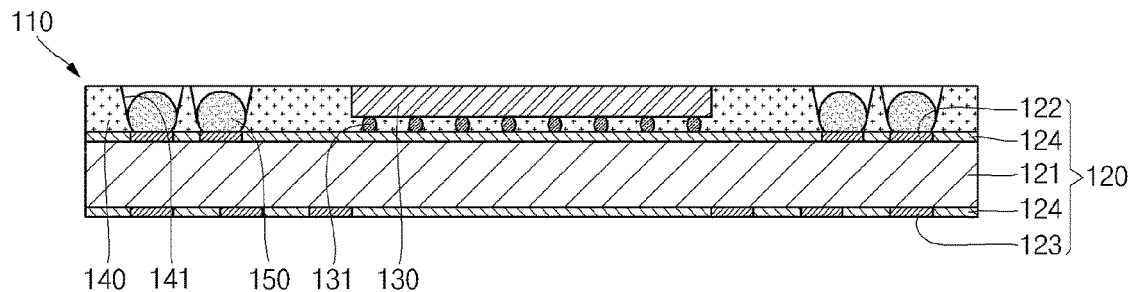
FIGS. 3A to 3D are cross-sectional views illustrating an example method of fabricating a semiconductor package, in accordance with various aspects of the present disclosure.

In the preparing of the semiconductor device, as illustrated in FIG. 3A, the semiconductor device 110 is prepared, the semiconductor device 110 including a circuit board 120 having a first circuit pattern 122 formed on its top surface, a semiconductor die 130 mounted on a top surface of the circuit board 120, an encapsulant 140 encapsulating the semiconductor die 130 from an upper portion of the circuit board 120, and conductive structures 150 (e.g., conductive bumps or balls, pillars, wires, etc.) formed on the first circuit pattern 122 and penetrating (e.g., extending partly through, extending completely through, or extending completely through and beyond) the encapsulant 140. Here, the circuit board 120 may, for example, include an insulating layer 121 having planar top and bottom surfaces, the first circuit pattern 122 formed on the top surface of the insulating layer 121, a second circuit pattern 123 formed on the bottom surface of the insulating layer 121 and a passivation layer 124 formed along outer peripheral edges of the first and second circuit patterns 122 and 123 to a predetermined thickness.

Figure 3B:
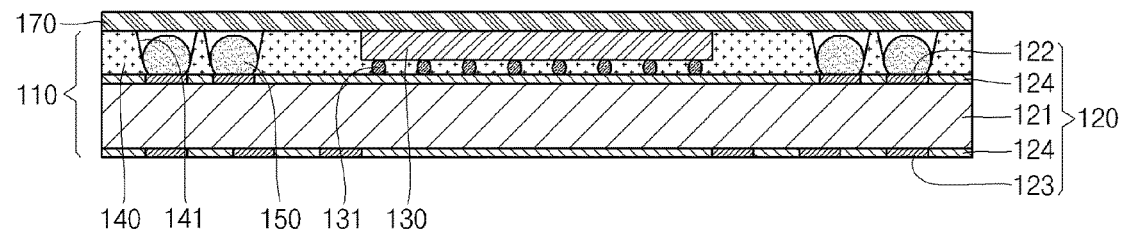

In the forming of the interlayer member, as illustrated in FIG. 3B, the interlayer member 170 is formed (e.g., coated, etc.) on the semiconductor device 110. Here, the interlayer member 170 may be formed to entirely cover the top portion of the semiconductor device 110. The interlayer member 170 may, for example, be formed of an epoxy flux, an anisotropically conductive paste (ACP), etc. The epoxy flux may, for example, cover surrounding areas of the conductive structures 150 and the conductive structures 163 of the interposer 160, which will later be described, thereby improving adhesion between the conductive structures 150 and the conductive structures 163 and allowing the heat generated from the semiconductor die 130 to be transferred to the interposer 160 to then be transferred (e.g., radiated, conducted, convected, etc.) to the outside. In addition, the anisotropically conductive paste (ACP) may include a binder and a conductive filler mixed therein and is used to mechanically and electrically connect upper and lower electrodes combined with each other by thermal compression. In addition, since the binder functions as an insulator, an insulating property is maintained between conductive material existing in adjacent circuits.

Figure 3C:
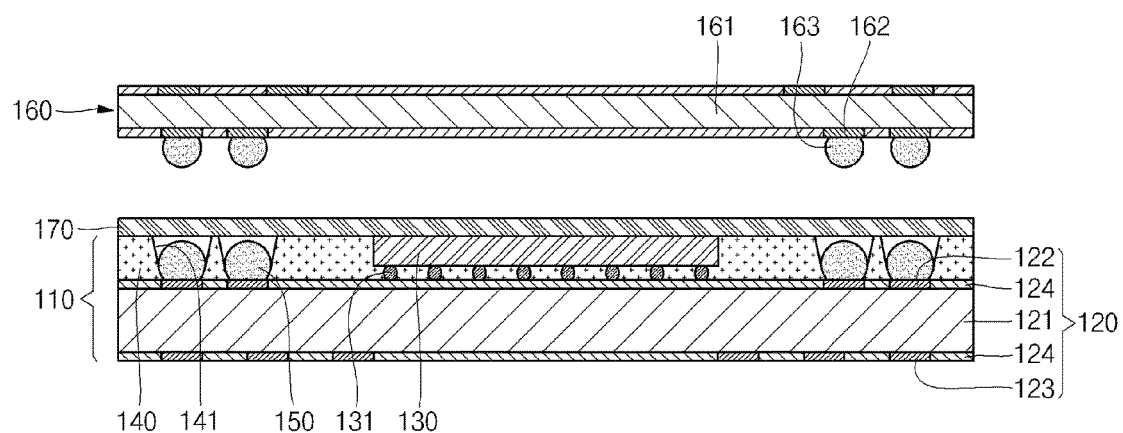
Figure 3D:
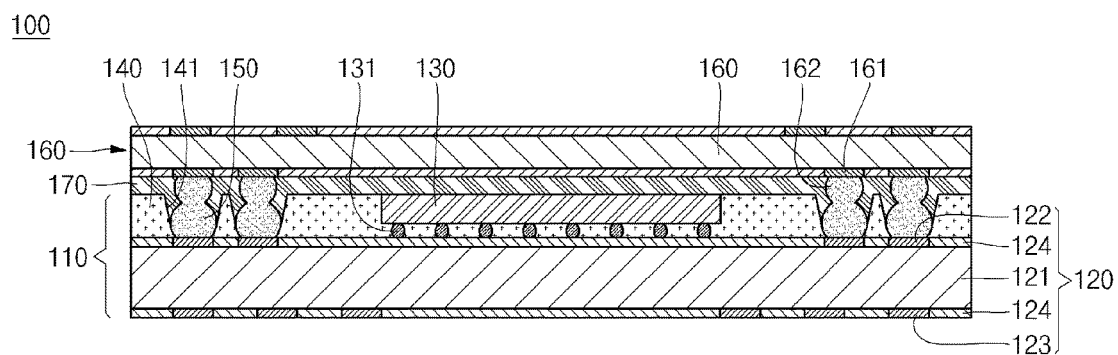

In the performing of the reflow process, as illustrated in FIG. 3C, the interposer 160 is positioned on the interlayer member 170 and a reflow process is performed thereon, the interposer 160 including an insulator 161, a circuit pattern 162 formed on a bottom surface of the insulator 161 and conductive structures 163 formed on the circuit pattern 162. Accordingly, as illustrated in FIG. 3D, the conductive structures 150 of the semiconductor device 110 are welded (or otherwise attached) to the conductive structures 163 of the interposer 160. In addition, the interlayer member 170 is cured between the semiconductor device 110 and the interposer 160, thereby improving bondability between the semiconductor device 110 and the interposer 160.

FIGS. 4A to 4G are cross-sectional views illustrating another example method of fabricating a semiconductor package, in accordance with various aspects of the present disclosure.

The method of fabricating (or manufacturing) a semiconductor package according to another example of the present disclosure includes preparing a semiconductor device, forming a first interlayer member part, performing a reflow process and forming a second interlayer member part. Hereinafter, the method of fabricating a semiconductor package according to another example of the present disclosure will be described in detail with reference to FIGS. 4A to 4G. Note that the example method may share any or all characteristics with any one or more other methods discussed herein.

Figure 4A:
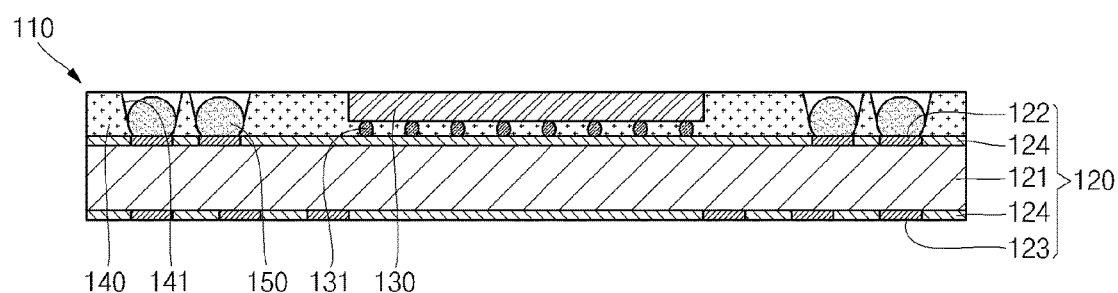
FIGS. 4A to 4G are cross-sectional views illustrating another example method of fabricating a semiconductor package, in accordance with various aspects of the present disclosure.

In the preparing of the semiconductor device, as illustrated in FIG. 4A, the semiconductor device 110 is prepared, the semiconductor device 110 including a circuit board 120 having a first circuit pattern 122 formed on its top surface, a semiconductor die 130 mounted on a top surface of the circuit board 120, an encapsulant 140 encapsulating the semiconductor die 130 from an upper portion of the circuit board 120, and conductive structures 150 (e.g., conductive bumps or balls, pillars, wires, etc.) formed on the first circuit pattern 122 and penetrating (e.g., extending partially through, extending completely through, extending completely through and past, etc.) the encapsulant 140.

Figure 4B:
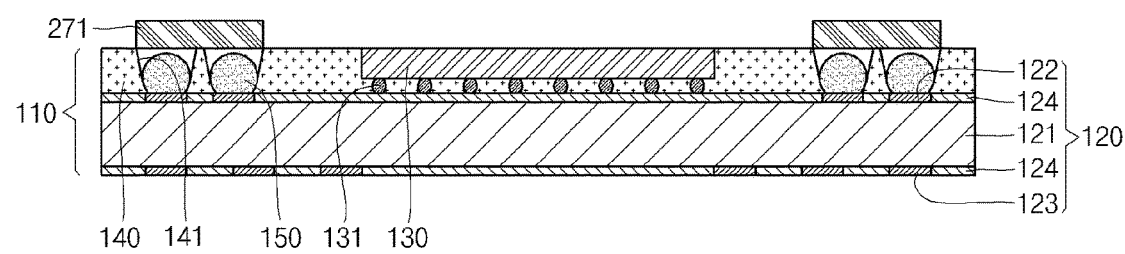

In the forming of the first interlayer member part, as illustrated in FIG. 4B, the first interlayer member part 271 is formed on the semiconductor device 110. Here, the first interlayer member part 271 is formed to cover top portions of through vias 141 having conductive structures 150 formed in the semiconductor device 110. The first interlayer member part 271 may be formed of an epoxy flux.

Figure 4C:
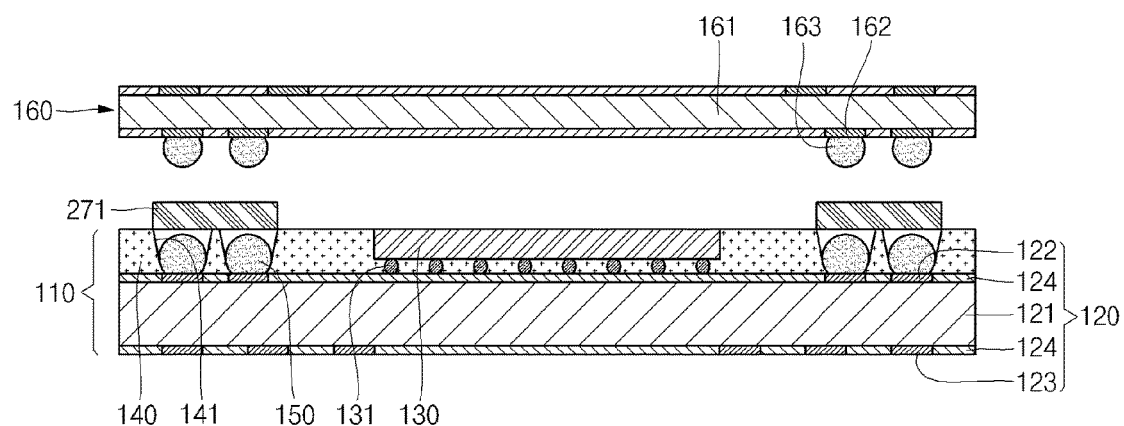
Figure 4D:
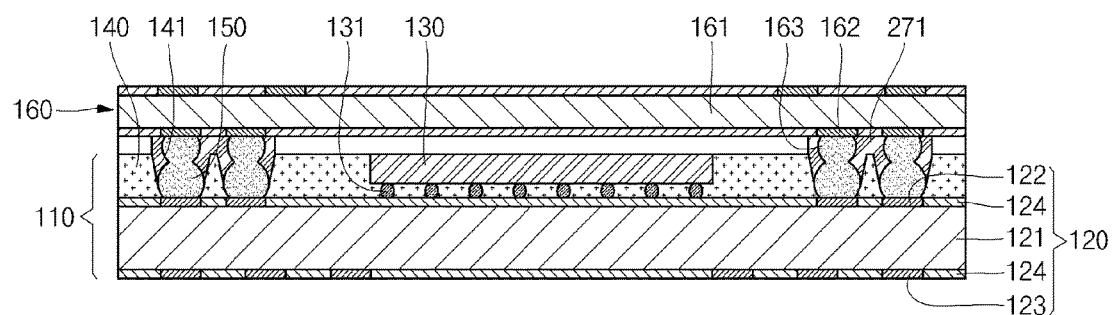

In the performing of the reflow process, as illustrated in FIG. 4C, a interposer 160 is positioned on the first interlayer member part 271 and a reflow process is performed thereon, the interposer 160 including an insulator 161, a circuit pattern 162 formed on a bottom surface of the insulator 161 and conductive structures (e.g., conductive bumps or balls, solder balls, pillars, wires, etc.) formed on the circuit pattern 162. Accordingly, as illustrated in FIG. 4D, the conductive structures 150 of (or attached to) the semiconductor device 110 are welded (or otherwise connected) to the conductive structures 163 of (or attached to) the interposer 160. In addition, the first interlayer member part 271 is cured while covering lateral surfaces of the conductive bumps 150 and the solder balls 163, thereby improving bondability between the semiconductor device 110 and the interposer 160.

Figure 4E:
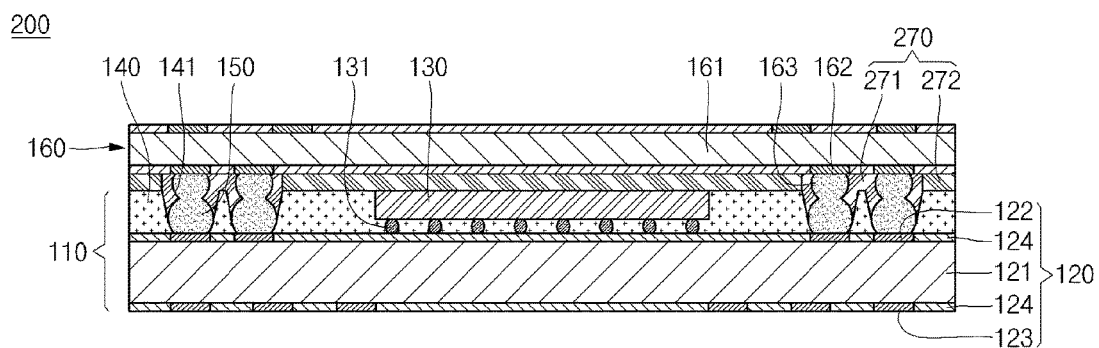

In the forming of the second interlayer member part, as illustrated in FIG. 4E, a second interlayer member part 272 is injected into a portion between the semiconductor device 110 and the interposer 160, followed by curing. The second interlayer member part 272 may, for example, be formed of a general adhesive, such as an epoxy resin. Accordingly, the semiconductor package 200 according to the present disclosure can be completed.

Figure 4F:
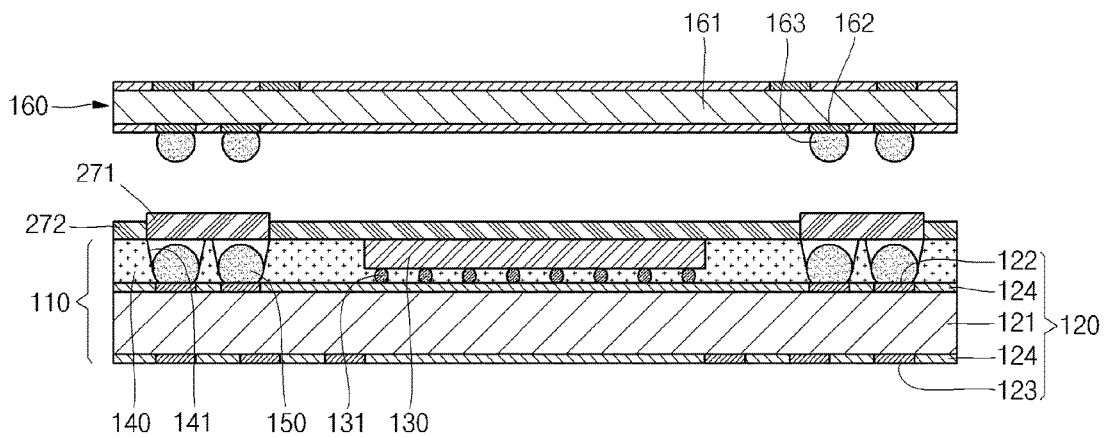

In addition, for example, the second interlayer member part 272 may be pre-formed on the semiconductor device 110 in the forming of the first interlayer member part, as illustrated in FIG. 4F. For example, after the first interlayer member part 271 and the second interlayer member part 272 are both formed on the semiconductor device 110, a reflow process is then performed, and the semiconductor package 200 according to the present disclosure may then be completed, as illustrated in FIG. 4E.

Figure 4G:
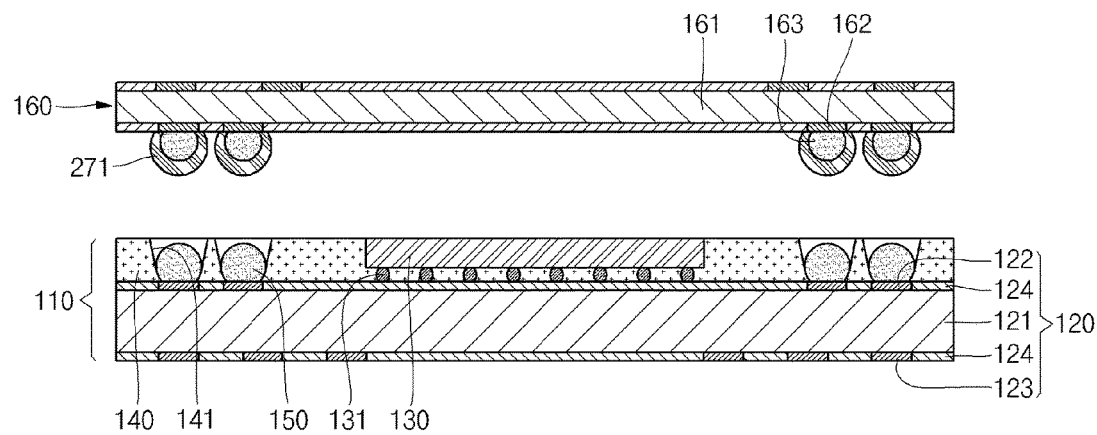

Further, for example, the first interlayer member part 271 may be performed by dipping, as illustrated in FIG. 4G. For example, after the first interlayer member part 271 is pre-formed on the conductive structures 163 of the interposer 160 by dipping, the interposer 160 is mounted on the semiconductor device 110, followed by performing a reflow process, thereby allowing the first interlayer member part 271 to cover lateral surfaces of the conductive structures 150 and the conductive structures 163, as illustrated in FIG. 4D.

Figure 5:
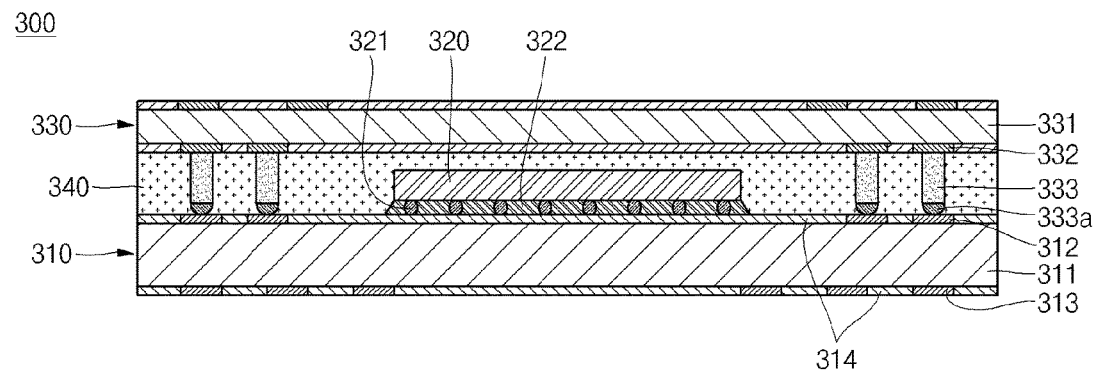
FIG. 5 is a cross-sectional view illustrating an example semiconductor package in accordance with various aspects of the present disclosure.

FIG. 5 is a cross-sectional view illustrating an example semiconductor package in accordance with various aspects of the present disclosure.

Referring to FIG. 5, the semiconductor package 300 according to still another example of the present disclosure includes a circuit board 310, a semiconductor die 320, an interposer 330 and an interlayer member 340. Note that the example semiconductor package 300 may share any or all characteristics with any one or more other semiconductor packages discussed herein The circuit board 310 includes an insulating layer 311 having planar top and bottom surfaces, a first circuit pattern 312 formed on a top surface of the insulating layer 311, a second circuit pattern 313 formed on a bottom surface of the insulating layer 311, and a passivation layer 314 formed along outer peripheral edges of the first and second circuit patterns 312 and 313 to a predetermined thickness. The circuit board 310 may, for example, be a printed circuit board (PCB) (e.g., a package or device substrate) having opposite surfaces. Here, conductive structures (e.g., conductive bumps or balls, pillars, wires, etc.) (not shown) may be welded (or otherwise attached) to the second circuit pattern 313 to then be electrically connected to an external circuit.

The semiconductor die 320 is mounted on the circuit board 310. The semiconductor die 320 may, for example, be generally made of a silicon material and has a plurality of semiconductor devices formed therein. In addition, a plurality of conductive structures 321 (e.g., conductive bumps or balls, solder balls, pillars, wires, etc.) are formed under the semiconductor die 320. The semiconductor die 320 is electrically connected to the circuit board 310 through the conductive structures 321. The conductive structures 321 may, for example, be electrically connected to the first circuit pattern 312 of the circuit board 310. In addition, an underfill 322 may, for example, be formed between the semiconductor die 320 and the circuit board 310. The underfill 322 is injected into a space between the semiconductor die 320 and the circuit board 310 to then encapsulate the conductive structures 321.

The interposer 330 is mounted on the circuit board 310 and the semiconductor die 320. The interposer 330 includes an insulator 331 having planar top and bottom surfaces, a circuit pattern 332 formed on a bottom surface of the insulator 331 and a conductive structure 333 (e.g., conductive filler, pillar, wire, conductive bump or ball, etc.) formed on the circuit pattern 332. In addition, the interposer 330 may also include a circuit pattern formed on a top surface of the insulator 331 so as to stack semiconductor devices, such as memory chips or logic chips, thereon. The conductive structure 333 is electrically connected to the first circuit pattern 312 of the circuit board 310. A solder cap 333a may be formed in the conductive structure 333 to then be easily coupled to the first circuit pattern 312. The conductive structure 333 may, for example, be formed to have a height equal to or greater than that of the semiconductor die 320. The conductive structure 333 may, for example, electrically connect the interposer 330 and the semiconductor die 320 to each other through the first circuit pattern 312. In addition, the conductive structure 333 may comprise a copper filler (e.g., a copper pillar), but aspects of the present disclosure are not limited thereto. In addition, the interposer 330 may comprise a silicon substrate, a laminate substrate, a printed circuit board (PCB), etc.

The interlayer member 340 is formed between the circuit board 310 and the interposer 330. For example, the interlayer member 340 is formed between the circuit board 310 and the interposer 330 to cover lateral surfaces of the semiconductor die 320 and the conductive structure 333 positioned between the circuit board 310 and the interposer 330.

The interlayer member 340 may, for example, be formed of an epoxy flux. The epoxy flux may, for example, be applied to surrounding areas of the conductive structure 333, thereby improving adhesion between the solder cap 333a and the first circuit pattern 312 and allowing the heat generated from the semiconductor die 320 to be transferred to the interposer 330 to then be transferred (e.g., radiated, conducted, convected, etc.) to the outside. Accordingly, cooling efficiency of the semiconductor package 300 according to the present disclosure may be improved. For example, the interlayer member 340 may tightly couple the circuit board 310 to the interposer 330. In addition, the interlayer member 340 may reduce warpage occurring between the circuit board 310 and the interposer 330.

In addition, the interlayer member 340 may be formed by injecting an epoxy resin or an epoxy molding compound (EMC) into a space between the circuit board 310 and the interposer 330. Further, the interlayer member 340 may also be formed of an anisotropically conductive paste (ACP). The anisotropically conductive paste (ACP) includes a binder and a conductive filler mixed therein and is used to mechanically and electrically connect upper and lower electrodes combined with each other, for example by thermal compression. In addition, since the binder functions as an insulator, an insulating property is maintained between conductive materials (e.g., conductive fillers, conductive structures, etc.) existing in adjacent circuits.

Figure 6:
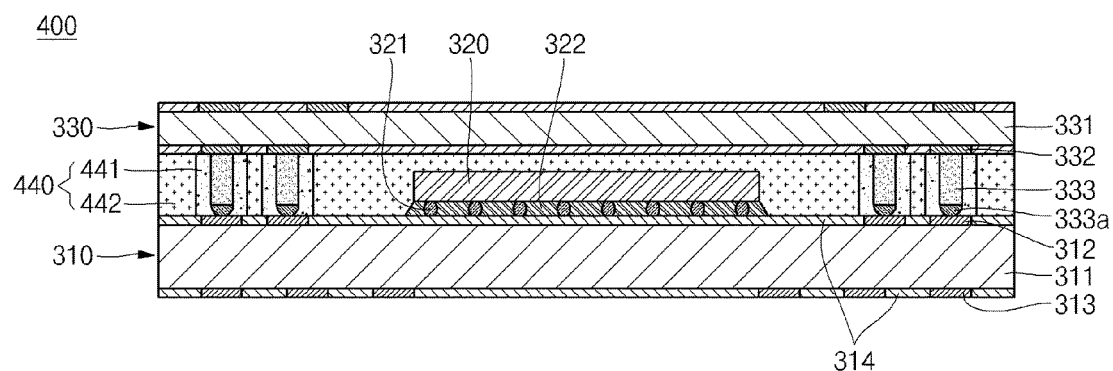
FIG. 6 is a cross-sectional view illustrating an example semiconductor package in accordance with various aspects of the present disclosure.

FIG. 6 is a cross-sectional view illustrating an example semiconductor package in accordance with various aspects of the present disclosure.

Referring to FIG. 6, the semiconductor package 400 according to still another example of the present disclosure includes a circuit board 310, a semiconductor die 320, an interposer 330 and an interlayer member 440. The semiconductor package 400 shown in FIG. 6 is substantially the same as the semiconductor package 300 shown in FIG. 5, and the following description the following description will generally focus on differences therebetween. Note that the example semiconductor package 400 may share any or all characteristics with any one or more other semiconductor packages discussed herein.

The interlayer member 440 is formed between the circuit board 310 and the interposer 330. For example, the interlayer member 440 includes a first interlayer member part 441 covering lateral surfaces of the conductive structure 333 (e.g., conductive filler, pillar, wire, conductive bump or ball, etc.) and a second interlayer member part 442 formed at least along an outer peripheral edge of the first interlayer member part 441.

The first interlayer member part 441 is formed to cover the lateral surfaces of the conductive structure 333. In addition, the first interlayer member part 441 is formed in vicinity of the first circuit pattern 312 of the circuit board 310 electrically connected to the conductive structure 333 and the circuit pattern 332 of the interposer 330. In addition, the first interlayer member part 441 may be formed of an epoxy flux and may be formed to cover a solder cap 333a of the conductive structure 333 and the first circuit pattern 312 of the circuit board 310. Therefore, the first interlayer member part 441 may improve adhesion between the conductive structure 333 and the first circuit pattern 312.

The second interlayer member part 442 is formed along the outer peripheral edge of the first interlayer member part 441. For example, the second interlayer member part 442 may be formed between the circuit board 310 and the interposer 330, where the conductive structure 333 is not formed. For example, the second interlayer member part 442 may be formed between the circuit board 310 and the interposer 330 and/or between the semiconductor die 320 and the interposer 330. The second interlayer member part 442 may transfer the heat generated from the semiconductor die 320 to the interposer 330 to then be transferred (e.g., radiated, conducted, convected, etc.) to the outside. In addition, the second interlayer member part 442 may, for example, be formed of a general adhesive, such as an epoxy resin, a molded underfill (MUF), etc.

Figure 7:
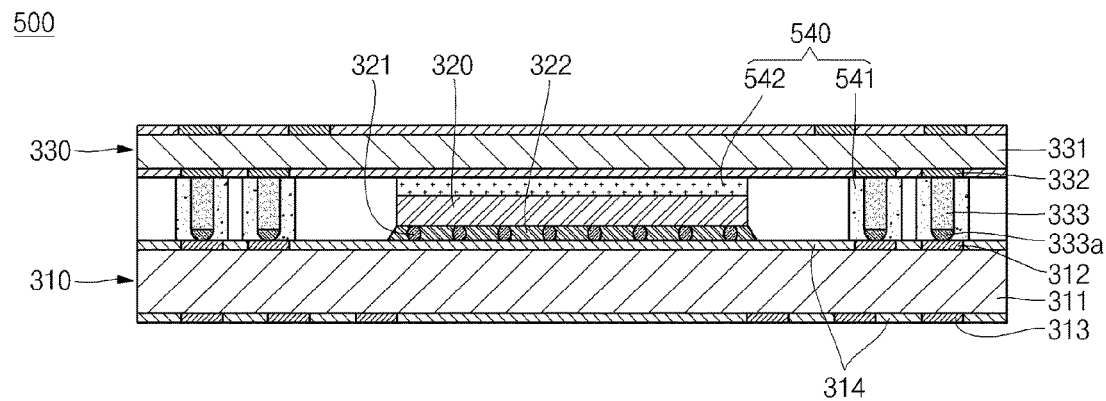
FIG. 7 is a cross-sectional view illustrating an example semiconductor package in accordance with various aspects of the present disclosure.

FIG. 7 is a cross-sectional view illustrating an example semiconductor package in accordance with various aspects of the present disclosure.

Referring to FIG. 7, the semiconductor package 500 according to still another example of the present disclosure includes a circuit board 310, a semiconductor die 320, an interposer 330 and an interlayer member 540. The semiconductor package 500 shown in FIG. 7 is substantially the same as the semiconductor package 400 shown in FIG. 6, and the following description the following description will generally focus on differences therebetween. Note that the example semiconductor package 500 may share any or all characteristics with any one or more other semiconductor packages discussed herein.

The interlayer member 540 is formed between the circuit board 310 and the interposer 330. For example, the interlayer member 540 includes a first interlayer member part 541 covering lateral surfaces of the conductive structure 333 and a second interlayer member part 542 formed between the semiconductor die 320 and the interposer 330. For example, in the semiconductor package 500 shown in FIG. 7, the second interlayer member part 542 is formed only between the semiconductor die 320 and the interposer 330. In an example implementation, there may be voids or gaps between the first interlayer member part 541 and the second interlayer member part 542, which may then be left void or may be wholly or partially filled with other material.

The second interlayer member part 542, formed between the semiconductor die 320 and the interposer 330, may transfer the heat generated from the semiconductor die 320 to the interposer 330 to then transfer (e.g., radiate, conduct, convect, etc.) the heat to the outside. The second interlayer member part 542 may, for example, be formed of a thermally conductive adhesive.

FIGS. 8A to 8D are cross-sectional views illustrating still another example method of fabricating a semiconductor package, in accordance with various aspects of the present disclosure.

The method of fabricating (or manufacturing) a semiconductor package according to still another example of the present disclosure includes attaching a semiconductor die, forming an interlayer member and performing a reflow process. Hereinafter, the method of fabricating a semiconductor package according to still another example of the present disclosure will be described in detail with reference to FIGS. 8A to 8D. Note that the example method may share any or all characteristics with any one or more other methods discussed herein.

Figure 8A:
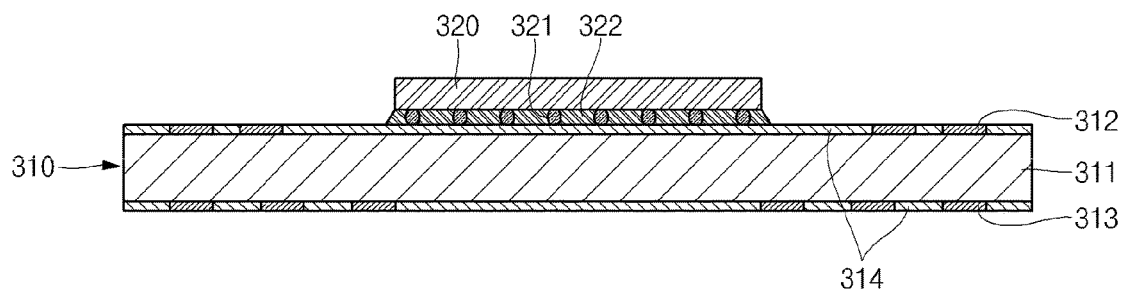
FIGS. 8A to 8D are cross-sectional views illustrating still another example method of fabricating a semiconductor package, in accordance with various aspects of the present disclosure.

In the attaching of the semiconductor die, as illustrated in FIG. 8A, the semiconductor die 320 is attached on a circuit board 310. Here, the circuit board 310 includes an insulating layer 311, a first circuit pattern 312 formed on a top surface of the insulating layer 311, a second circuit pattern 313 formed on a bottom surface of the insulating layer 311, and a passivation layer 314 formed along outer peripheral edges of the first and second circuit patterns 312 and 313 to a predetermined thickness. In addition, the semiconductor die 320 may, for example, be generally made of a silicon material and has a plurality of semiconductor devices formed therein. In addition, a plurality of conductive structures 321 (e.g., conductive bumps or balls, solder balls, pillars, wires, etc.) are formed under the semiconductor die 320 and an underfill 322 is formed between the semiconductor die 320 and the circuit board 310. In the attaching of the semiconductor die, the conductive structures 321 are electrically connected to the first circuit pattern 312.

Figure 8B:
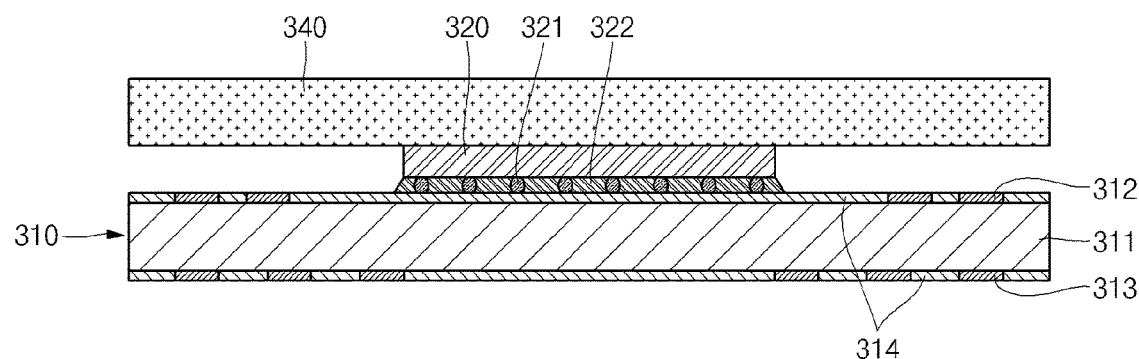

In the forming of the interlayer member, as illustrated in FIG. 8B, the interlayer member 340 is formed (e.g., coated, etc.) on the circuit board 310 and the semiconductor die 320.

The interlayer member 340 may, for example, be formed of an epoxy flux, an anisotropically conductive paste (ACP), etc. Here, the epoxy flux may, for example, be applied to surrounding areas of a conductive structure 333 (e.g., conductive filler, pillar, wire, conductive bump or ball, etc.) of an interposer 330, which will later be described, thereby improving adhesion between the conductive structure 333 and the first circuit pattern 312 and allowing the heat generated from the semiconductor die 320 to be transferred to the interposer 330 to then be transferred (e.g., radiated, conducted, convected, etc.) to the outside. In addition, the anisotropically conductive paste (ACP) may, for example, include a binder and a conductive filler mixed therein and is used to mechanically and electrically connect upper and lower electrodes combined with each other by thermal compression. In addition, since the binder functions as an insulator, an insulating property is maintained between conductive structures (e.g., fillers, etc.) existing in adjacent circuits.

Figure 8C:
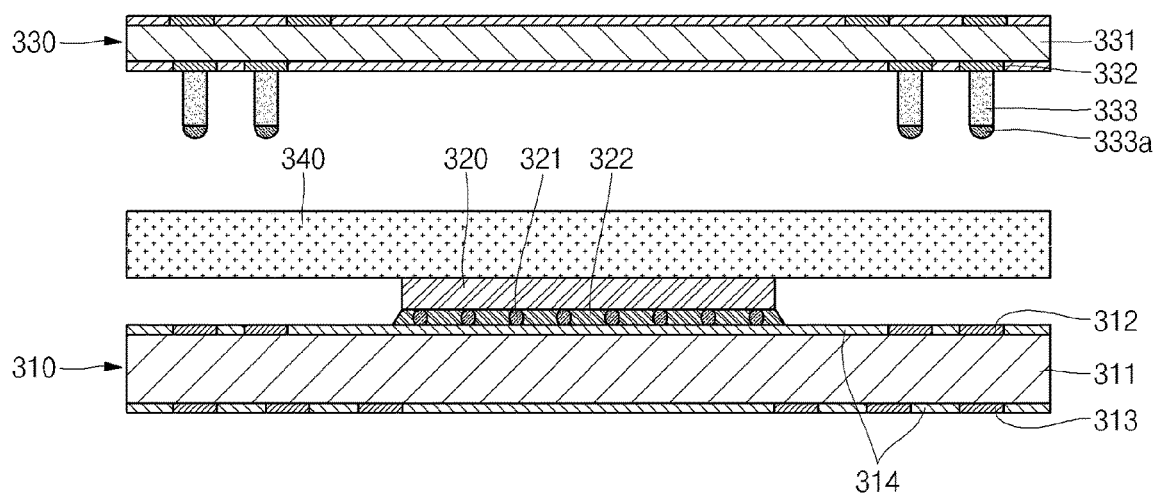
Figure 8D:
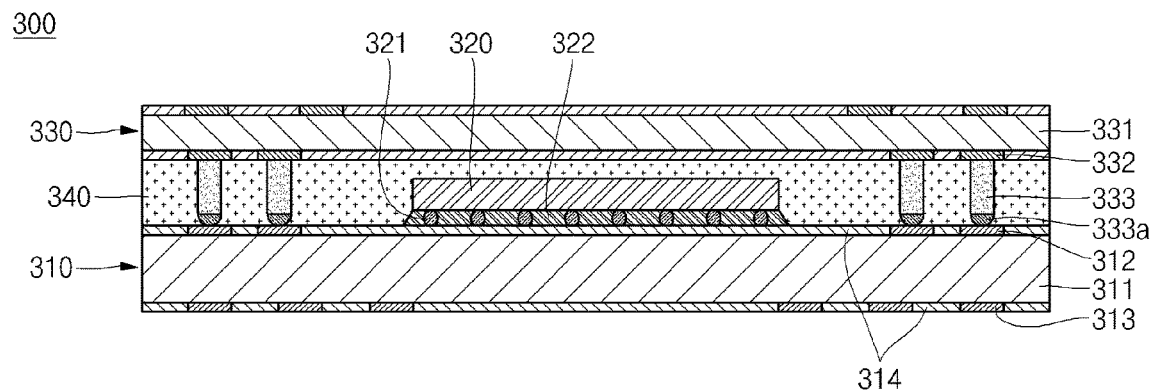

In the performing of the reflow process, as illustrated in FIG. 8C, the interposer 330 is positioned on the interlayer member 340 and a reflow process is performed thereon, the interposer 340 including an insulator 331, a circuit pattern 332 formed on a bottom surface of the insulator 331 and the conductive structure 333 formed on the circuit pattern 332. As illustrated in FIG. 8D, a solder cap 333a of the conductive structure 333 is welded (or otherwise attached) to the first circuit pattern 312 of the circuit board 310. In addition, the interlayer member 340 is cured between the circuit board 310 and the interposer 330, thereby improving bondability between each of the circuit board 310, the semiconductor die 320 and the interposer 330.

Figure 9A:
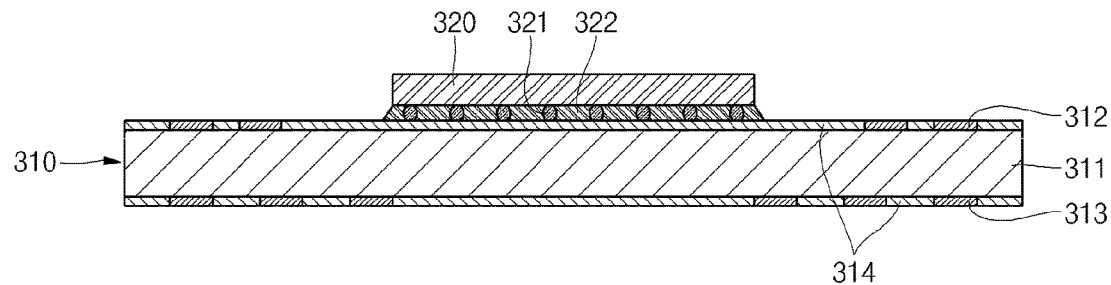
FIGS. 9A to 9E are cross-sectional views illustrating an additional example method of fabricating a semiconductor package, in accordance with various aspects of the present disclosure.
Figure 9B:
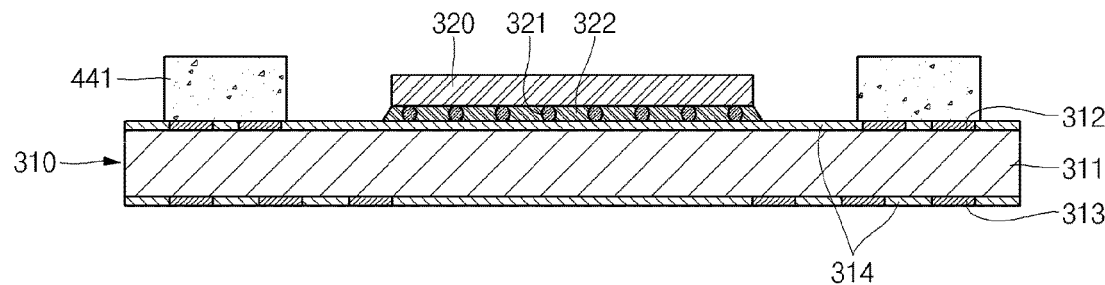
Figure 9C:
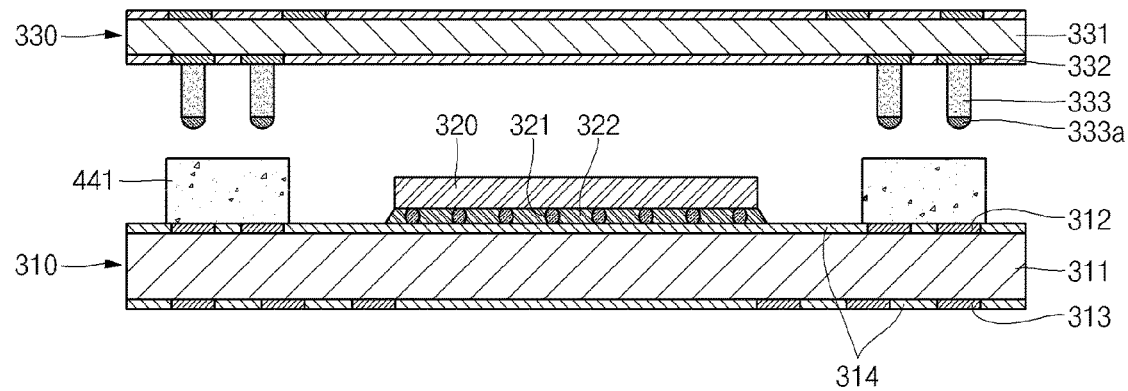
Figure 9D:
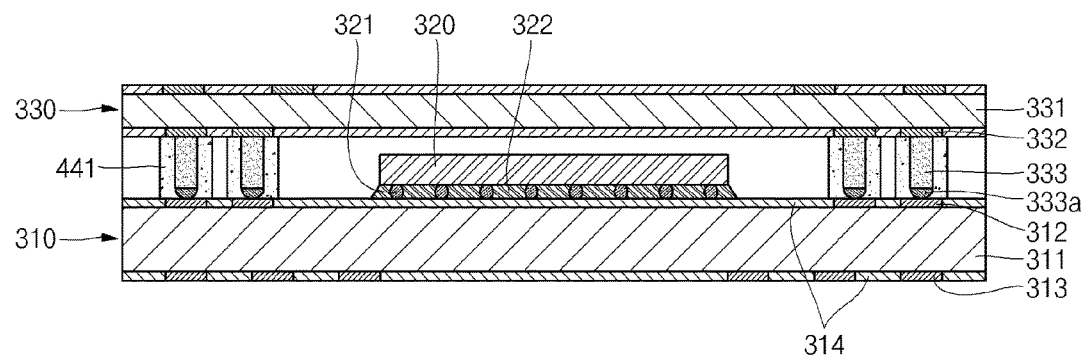
Figure 9E:
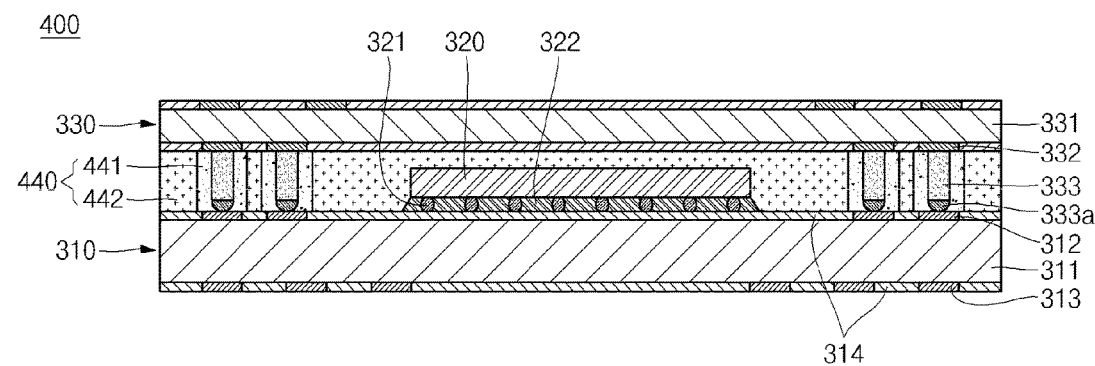
Figure 10A:
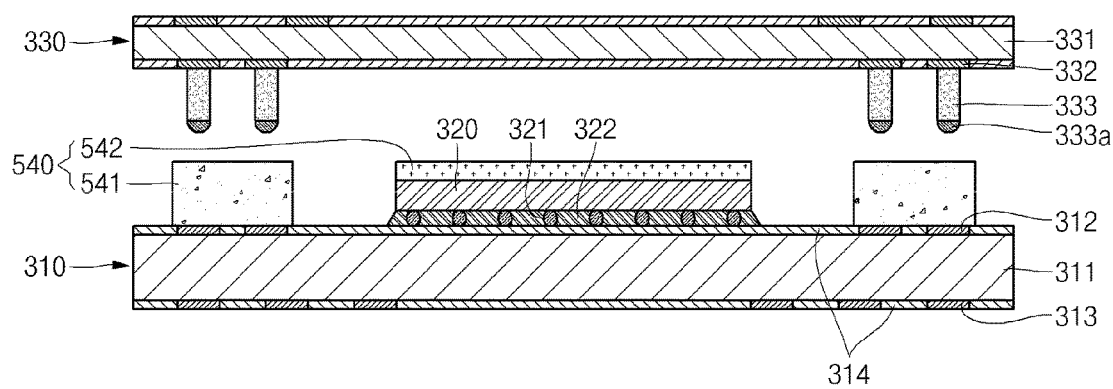
FIGS. 10A and 10B are cross-sectional views illustrating a further example method of fabricating a semiconductor package, in accordance with various aspects of the present disclosure.
Figure 10B:
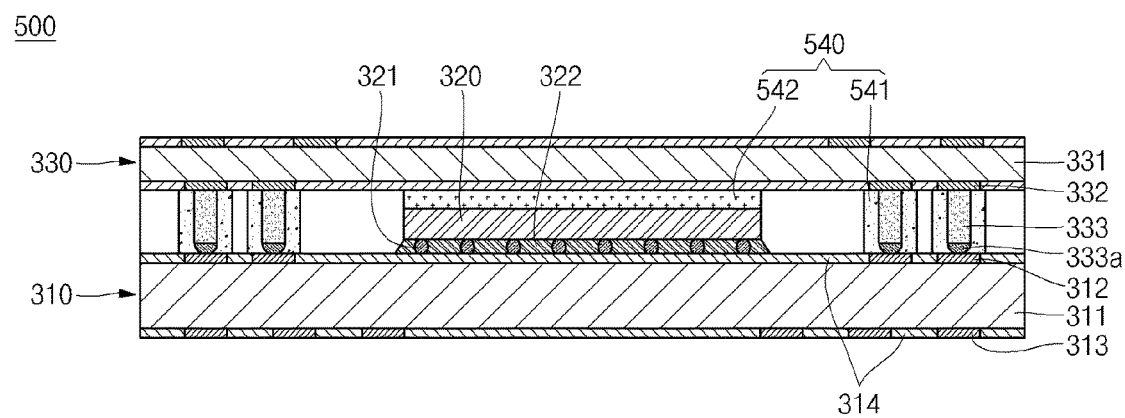

FIGS. 9A to 9E are cross-sectional views illustrating an additional example method of fabricating a semiconductor package, in accordance with various aspects of the present disclosure, and FIGS. 10A and 10B are cross-sectional views illustrating a further example method of fabricating a semiconductor package, in accordance with various aspects of the present disclosure.

The method of fabricating a semiconductor package according to still another example of the present disclosure includes attaching a semiconductor die, forming a first interlayer member part, performing a reflow process and forming a second interlayer member part. Hereinafter, the fabricating method of a semiconductor package according to still another example of the present disclosure will be described in detail with reference to FIGS. 9A to 9E. Note that the example methods may share any or all characteristics with any one or more other methods discussed herein.

In the attaching of the semiconductor die, as illustrated in FIG. 9A, the semiconductor die 320 is attached on a circuit board 310. Here, the circuit board 310 includes an insulating layer 311, a first circuit pattern 312 formed on a top surface of the insulating layer 311, a second circuit pattern 313 formed on a bottom surface of the insulating layer 311, and a passivation layer 314 formed along outer peripheral edges of the first and second circuit patterns 312 and 313 to a predetermined thickness. In addition, the semiconductor die 320 may, for example, be generally made of a silicon material and has a plurality of semiconductor devices formed therein. In addition, a plurality of solder structures 321 (e.g., conductive bumps or balls, solder balls, pillars, wires, etc.) are formed under the semiconductor die 320 and an underfill 322 is formed between the semiconductor die 320 and the circuit board 310. In the attaching of the semiconductor die, the conductive structures 321 are electrically connected to the first circuit pattern 312.

In the forming of the first interlayer member part, as illustrated in FIG. 9B, the first interlayer member part 441 is formed on the circuit board 310. Here, the first interlayer member part 441 is formed (e.g., coated, etc.) to cover a top portion of the first circuit pattern 312 formed on the circuit board 310. The first interlayer member part 441 may, for example, be formed of an epoxy flux.

In the performing of the reflow process, as illustrated in FIG. 9C, the interposer 330 is positioned on the first interlayer member part 441 and a reflow process is performed thereon, the first interlayer member part 441 including an insulator 331, a circuit pattern 332 formed on a bottom surface of the insulator 331 and the conductive structure 333 (e.g., conductive filler, pillar, wire, conductive bump or ball, etc.) formed on the circuit pattern 332. As illustrated in FIG. 9D, a solder cap 333a of the conductive structure 333 is welded to the first circuit pattern 312. In addition, the first interlayer member part 441 is cured while covering lateral surfaces of the conductive structure 333, and the circuit pattern 332 of the interposer 330 is electrically connected to the conductive structure 333 and the first circuit pattern 312 of the circuit board 310, for example improving bondability between the circuit board 310 and the interposer 330.

In the forming of the second interlayer member part, as illustrated in FIG. 9E, the second interlayer member part 442 is injected into a space between the circuit board 310 and the interposer 330, followed by curing. The second interlayer member part 442 may, for example, be formed of a general adhesive, such as an epoxy resin, molded underfill (MUF), etc. Accordingly, the example semiconductor package 400 according to the present example can be produced.

In addition, the second interlayer member part 542 may be pre-formed on the semiconductor die 320 in the forming of the first interlayer member part, as illustrated in FIG. 10A. For example, after the first interlayer member part 541 is formed on the first circuit pattern 312 of the circuit board 310 and the second interlayer member part 542 is formed on the semiconductor die 320, a reflow process may then be performed, and the semiconductor package 500 according to the present example may then be produced, as illustrated in FIG. 10B.

Figure 11:
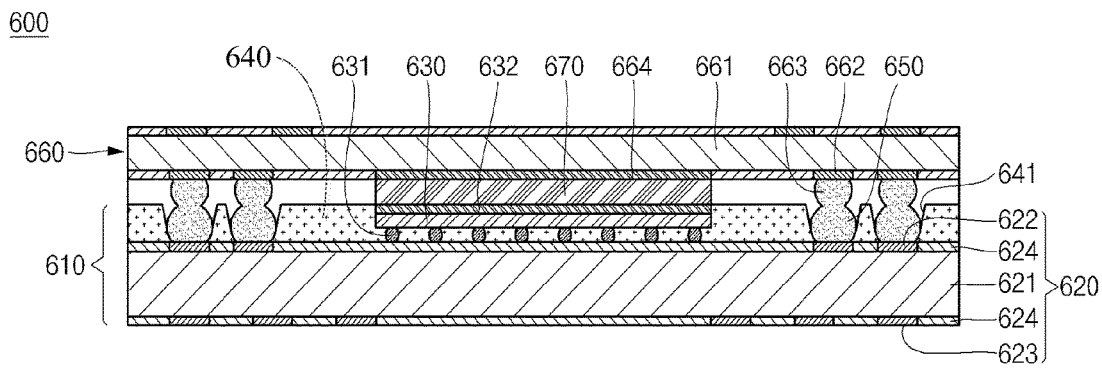
FIG. 11 is a cross-sectional view illustrating an example semiconductor package in accordance with various aspects of the present disclosure.

FIG. 11 is a cross-sectional view illustrating an example semiconductor package in accordance with various aspects of the present disclosure.

Referring to FIG. 11, the semiconductor package 600 according to still another example of the present invention includes a semiconductor device 610, an interposer 660 and a heat radiating member 670. Note that the example semiconductor package 600 may share any or all characteristics with any one or more other semiconductor packages discussed herein.

The semiconductor device 610 includes a circuit board 620, a semiconductor die 630, an encapsulant 640 and conductive structures 650 (e.g., conductive bumps or balls, pillars, wires, etc.).

The circuit board 620 includes an insulating layer 621 having planar top and bottom surfaces, a first circuit pattern 622 formed on a top surface of the insulating layer 621, a second circuit pattern 623 formed on a bottom surface of the insulating layer 621, and a passivation layer 624 formed along outer peripheral edges of the first and second circuit patterns 622 and 623 to a predetermined thickness. The circuit board 620 may be a printed circuit board (PCB) (e.g., a package substrate, etc.) having opposite surfaces. Here, conductive structures (e.g., conductive bumps or balls, solder balls, pillars, wires, etc.) (not shown) may be welded (or otherwise attached) to the second circuit pattern 623 to then be electrically connected to an external circuit.

The semiconductor die 630 is mounted on the circuit board 620. The semiconductor die 630 may, for example, be generally made of a silicon material and has a plurality of semiconductor devices formed therein. In addition, a plurality of conductive structures 631 (e.g., conductive bumps or balls, solder balls, pillars, wires, etc.) are formed under the semiconductor die 630. The semiconductor die 630 is electrically connected to the circuit board 620 through the conductive structures 631. The conductive structures 631 may, for example, be electrically connected to the first circuit pattern 622 of the circuit board 620. In addition, a metal layer 632 may, for example, be formed on the semiconductor die 630. The metal layer 632 may be formed by coating a metal on the semiconductor die 630. For example, the metal layer 632 may be made of a conductive material, such as copper (Cu), gold (Au) or silver (Ag), but aspects of the present disclosure are not limited thereto.

The encapsulant 640 encapsulates the semiconductor die 630 from an upper portion of the circuit board 620. The encapsulant 640 may, for example, expose the metal layer 632 formed on the semiconductor die 630 to the outside of the encapsulant 640. In addition, through vias 641 are formed in the encapsulant 640. The through vias 641 may, for example, be formed over the first circuit pattern 622 of the circuit board 620 and expose the first circuit pattern 622 to the outside of the encapsulant 640.

The conductive structures 650 (e.g., conductive bumps or balls, pillars, wires, etc.) are formed on the first circuit pattern 622 and exposed to the outside of the encapsulant 640 by the through vias 641. The conductive structures 650 may, for example, be electrically connected to the semiconductor die 630 through the first circuit pattern 622. The conductive structures 650 may, for example, include tin/lead, leadless tin, equivalents thereof, etc., but aspects of the present disclosure are not limited thereto.

The interposer 660 is mounted on the semiconductor device 610. The interposer 560 includes an insulator 661 having planar top and bottom surfaces, a circuit pattern 662 formed on a bottom surface of the insulator 661 and conductive structures 663 (e.g., conductive bumps or balls, solder balls, pillars, wires, etc.) formed on the circuit pattern 662. In addition, the interposer 660 may also include a circuit pattern formed on a top surface of the insulator 661 so as to stack semiconductor devices, such as memory chips or logic chips, thereon. In addition, the interposer 660 may further include a conductive pad 664 formed on its bottom surface. Here, the conductive pad 664 may, for example, be formed at the center of the interposer 660 and the circuit pattern 662 is formed at an outer peripheral edge of the conductive pad 664. The circuit pattern 662 and the conductive pad 664 may, for example, be formed of the same material. In addition, the conductive pad 664 may be formed to correspond to the metal layer 632 of the semiconductor die 630. Further, the interposer 660 may also include a circuit pattern formed on a top surface of the insulator 661 so as to stack semiconductor devices, such as memory chips or logic chips, thereon.

The conductive structures 663 are electrically connected to the conductive structures 650 of the semiconductor device 610. For example, when the interposer 660 is mounted on the semiconductor device 610, the conductive structures 663 are welded (or otherwise attached) to the conductive structures 650 to electrically connect the interposer 660 and the semiconductor device 610 to each other. The interposer 660 may, for example, comprise a silicon substrate, a printed circuit board (PCB), etc.

The heat radiating member 670 is formed between the semiconductor device 610 and the interposer 660. For example, the heat radiating member 670 may be formed between the semiconductor device 610 and the conductive pad 664 of the interposer 660. In addition, the heat radiating member 670 may, for example, be formed of a solder paste (e.g., at least initially, prior to reflow if performed) and may be electrically connected (or at least heat-conductively connected) to the metal layer 632 and the conductive pad 664. The heat radiating member 670 may transfer the heat generated from the semiconductor die 630 to the interposer 660 to then be transferred (e.g., radiated, conducted, convected, etc.) to the outside. Accordingly, cooling efficiency of the semiconductor package 600 according to the present disclosure may be improved.

Figure 12:
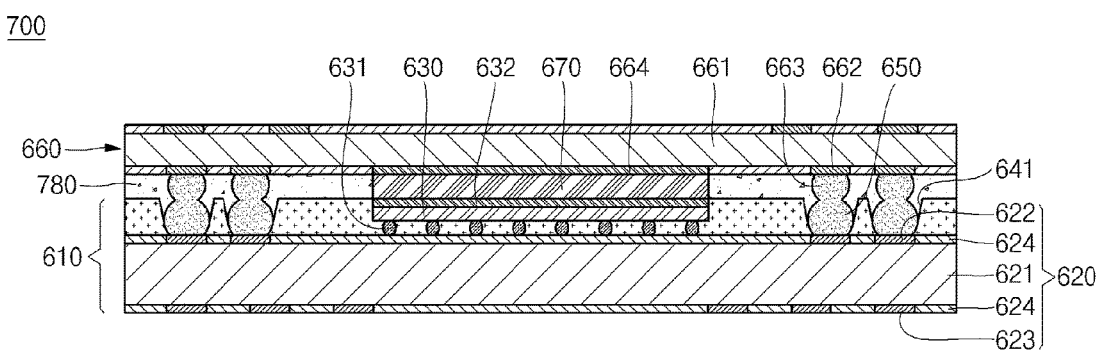
FIG. 12 is a cross-sectional view illustrating an example semiconductor package in accordance with various aspects of the present disclosure.

FIG. 12 is a cross-sectional view illustrating an example semiconductor package in accordance with various aspects of the present disclosure.

Referring to FIG. 12, the semiconductor package 700 according to still another example of the present disclosure includes a semiconductor device 610, an interposer 660, a heat radiating member 670 and an interlayer member 780. For example, the example semiconductor package 700 shown in FIG. 12 further includes the interlayer member 780, compared to the semiconductor package 600 shown in FIG. 11. Thus, the following description will focus on the interlayer member 780, which is a different feature between the semiconductor packages 600 and 700 shown in FIGS. 11 and 12. Note that the example semiconductor package 700 may share any or all characteristics with any one or more other semiconductor packages discussed herein.

The interlayer member 780 is formed between the semiconductor device 610 and the interposer 660. For example, the interlayer member 780 is formed to fill a space between the semiconductor device 610 and the interposer 660, where the heat radiating member 670 is not formed and/or where the conductive structures 650 and 663 are not formed. For example, the interlayer member 780 may be formed by injecting an underfill into a space between the semiconductor device 610 and the interposer 660, followed by curing, thereby more tightly coupling the semiconductor device 610 and the interposer 660 to each other. In addition, the interlayer member 780 may be formed of an epoxy flux, an epoxy resin or other adhesives, but not limited thereto.

In addition, the interlayer member 780 may reduce warpage occurring between the semiconductor device 610 and the interposer 660. As described above, the interlayer member 780 may improve the reliability of the semiconductor package 700 according to the present disclosure.

Figure 13:
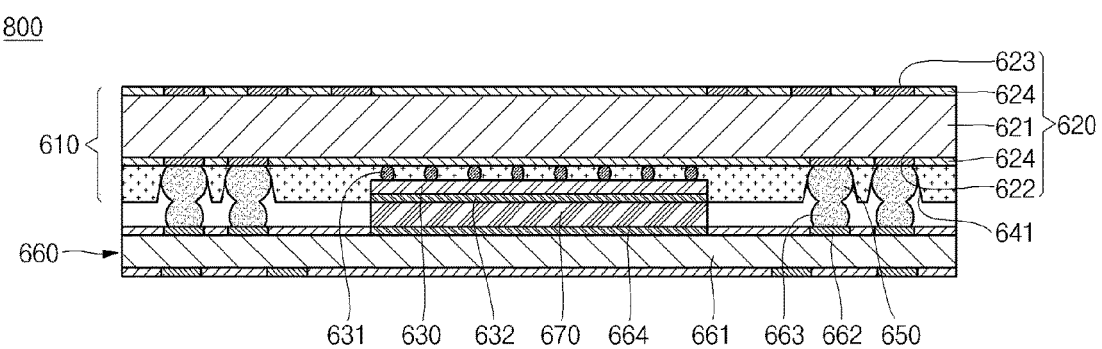
FIG. 13 is a cross-sectional view illustrating an example semiconductor package in accordance with various aspects of the present disclosure.

FIG. 13 is a cross-sectional view illustrating an example semiconductor package in accordance with various aspects of the present disclosure.

Referring to FIG. 13, the semiconductor package 800 according to still another example of the present disclosure includes an interposer 660, a semiconductor device 610 and a heat radiating member 670. The semiconductor package 800 shown in FIG. 13 is configured such that the semiconductor package 600 shown in FIG. 11 is reversed. For example, in the semiconductor package 800, the semiconductor device 610 is formed on the interposer 660 and the heat radiating member 670 is formed between the interposer 660 and the semiconductor device 610. Note that the example semiconductor package 800 may share any or all characteristics with any one or more other semiconductor packages discussed herein.

As described above, the semiconductor package 800 according to still another example of the present disclosure is slightly different from the semiconductor package 600 shown in FIG. 11 in that the semiconductor device 610 and the interposer 660 are just transposed, and a detailed description thereof will not be given.

FIGS. 14A to 14E are cross-sectional views illustrating a still further example method of fabricating a semiconductor package, in accordance with various aspects of the present disclosure.

The method of fabricating a semiconductor package according to still another example of the present disclosure includes preparing a semiconductor device, forming a heat radiating member, performing a reflow process and forming an interlayer member. Hereinafter, the method of fabricating a semiconductor package according to still another example of the present disclosure will be described in detail with reference to FIGS. 14A to 14E. Note that the example method may share any or all characteristics with any one or more other methods discussed herein.

Figure 14A:
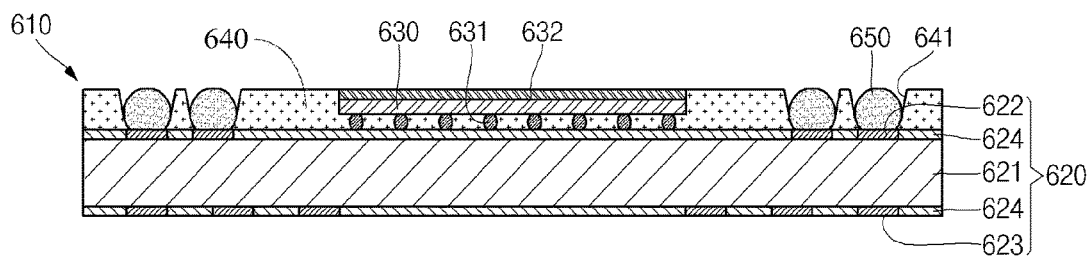
FIGS. 14A to 14E are cross-sectional views illustrating a still further example method of fabricating a semiconductor package, in accordance with various aspects of the present disclosure.

In the preparing of the semiconductor device, as illustrated in FIG. 14A, the semiconductor device 610 is prepared, the semiconductor device 610 including a circuit board 620 having a first circuit pattern 622 formed on its top surface, a semiconductor die 630 mounted on a top surface of the circuit board 620 and having a metal layer 632 formed thereon, an encapsulant 640 encapsulating the semiconductor die 630 from an upper portion of the circuit board 620, and conductive bumps 650 formed on the first circuit pattern 622 while penetrating the encapsulant 640. For example, the semiconductor device 610 (or any semiconductor device discussed herein) may include a plurality of semiconductor devices provided in panel types.

Figure 14B:
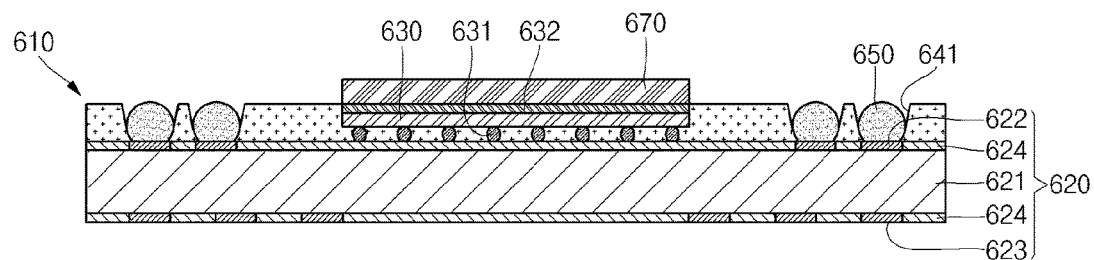

In the forming of the heat radiating member, as illustrated in FIG. 14B, the heat radiating member 670 is formed (e.g., coated, etc.) on the semiconductor die 630. For example, the heat radiating member 670 may be formed to cover the metal layer 632 formed on the semiconductor die 630. In addition, the heat radiating member 670 may be formed of a solder paste and may be electrically connected to the metal layer 632 of the semiconductor die 630 and a conductive pad 664 of an interposer 660, which will be described later.

Figure 14C:
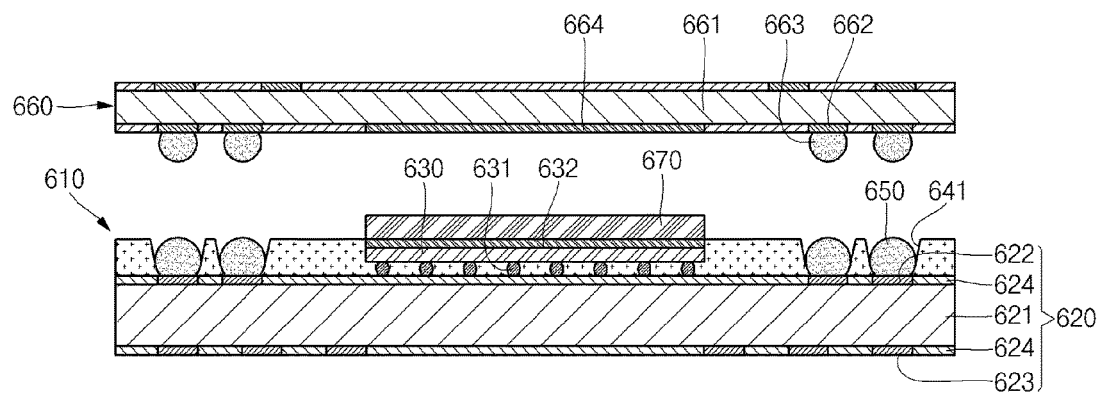
Figure 14D:
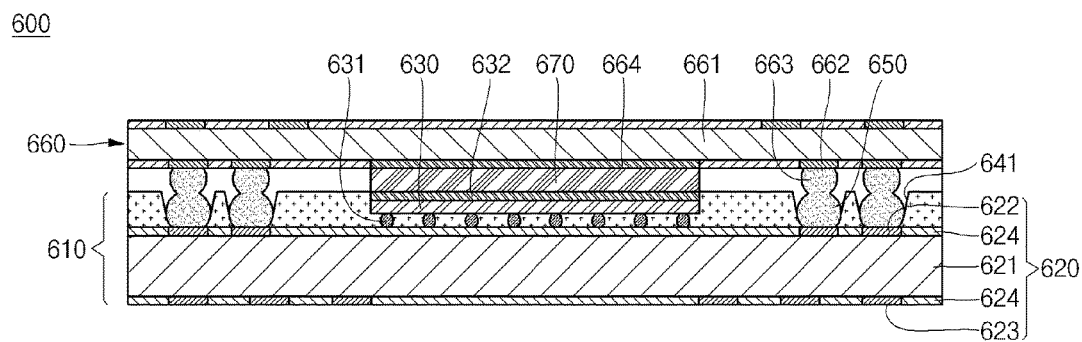

In the performing of the reflow process, as illustrated in FIG. 14C, the interposer 660 is positioned on the heat radiating member 670 and the reflow process is performed thereon, the interposer 660 including an insulator 661, a circuit pattern 662 formed on a bottom surface of the insulator 661, the conductive pad 664 and conductive structures 663 (e.g., conductive bumps or balls, solder balls, pillars, wires, etc.) formed on the circuit pattern 662. Accordingly, as illustrated in FIG. 14D, the conductive structures 650 (e.g., conductive bumps or balls, pillars, wires, etc.) of the semiconductor device 610 are welded (or otherwise attached) to the conductive structures 663 of the interposer 660. In addition, the heat radiating member 670 may be cured between the semiconductor device 610 and the interposer 660 may be electrically connected to the metal layer 632 and the conductive pad 664. Therefore, the heat radiating member 670 may transfer the heat generated from the semiconductor die 630 to the interposer 660 to then be transferred (e.g., radiated, conducted, convected, etc.) to the outside. According to the above-described fabricating method, the semiconductor package 700 according to the present example can be produced.

Figure 14E:
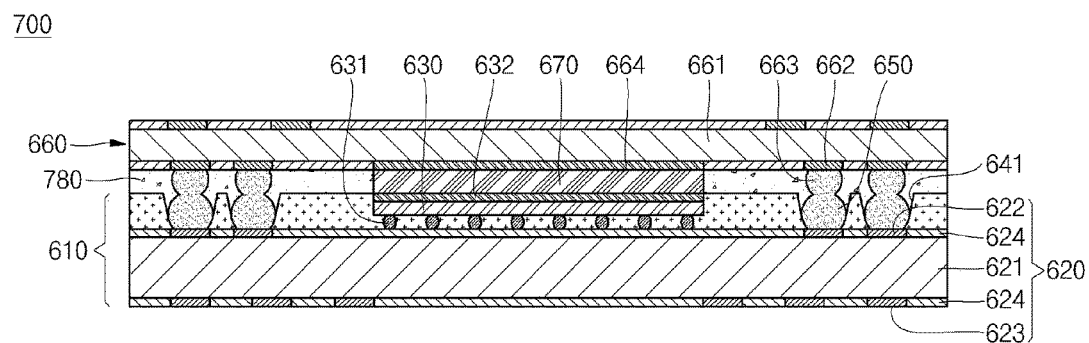

Alternatively, the semiconductor package 700 may be fabricated by further forming the interlayer member 780 between the semiconductor device 610 and the interposer 660, for example after the performing of the reflow process. For example, in forming of the interlayer member, as illustrated in FIG. 14E, the interlayer member 780 may be injected into a space the semiconductor device 610 and the interposer 660, followed by curing. The interlayer member 780 may, for example, be formed of an underfill, an epoxy flux, an epoxy resin, other adhesives, etc. The interlayer member 780 may improve bondability between the semiconductor device 610 and the interposer 660. In an example fabrication scenario, the semiconductor package 700 may be produced by sawing the panel-type semiconductor device 610 after the forming of the interlayer member.

FIGS. 15A to 15D are cross-sectional views illustrating yet another example method of fabricating a semiconductor package, in accordance with various aspects of the present disclosure.

The method of fabricating a semiconductor package according to still another example of the present disclosure includes preparing an interposer, forming a heat radiating member and performing a reflow process. Hereinafter, the method of fabricating a semiconductor package according to still another example of the present disclosure will be described in detail with reference to FIGS. 15A to 15D. Note that the example method may share any or all characteristics with any one or more other methods discussed herein.

Figure 15A:
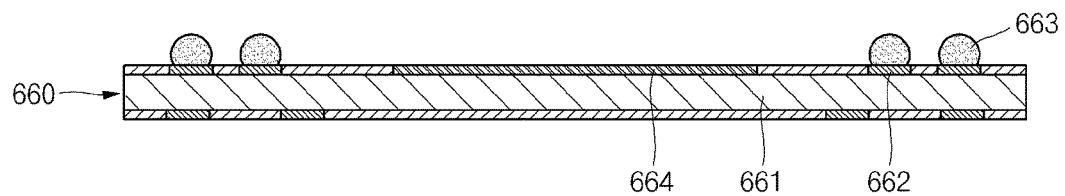
FIGS. 15A to 15D are cross-sectional views illustrating yet another example method of fabricating a semiconductor package, in accordance with various aspects of the present disclosure.

In the preparing of the interposer, as illustrated in FIG. 15A, the interposer 660 is prepared, the interposer 660 including an insulator 661, a circuit pattern 662 formed on a top surface of the insulator 661, a conductive pad 664 and conductive structures 663 (e.g., conductive bumps or balls, solder balls, pillars, wires, etc.) formed on the circuit pattern 662. For example, the interposer 660 may, for example, include a plurality of interposers provided in panel types.

Figure 15B:
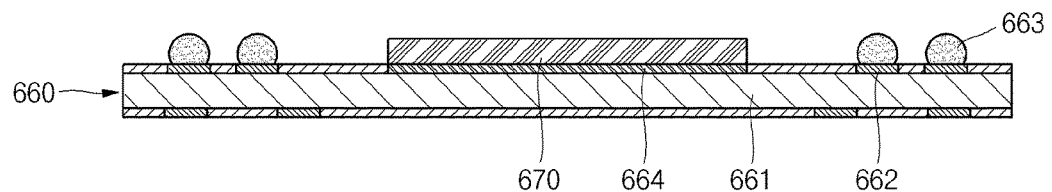

In the forming of the heat radiating member, as illustrated in FIG. 15B, the heat radiating member 670 is formed (e.g., coated, etc.) on the interposer 660. Here, the heat radiating member 670 is formed to cover the conductive pad 664 formed on the interposer 660. In addition, the heat radiating member 670 may, for example, be formed of a solder paste and be electrically connected to the conductive pad 664 of the interposer 660 and a metal layer 632 of a semiconductor die 630, which will later be described.

Figure 15C:
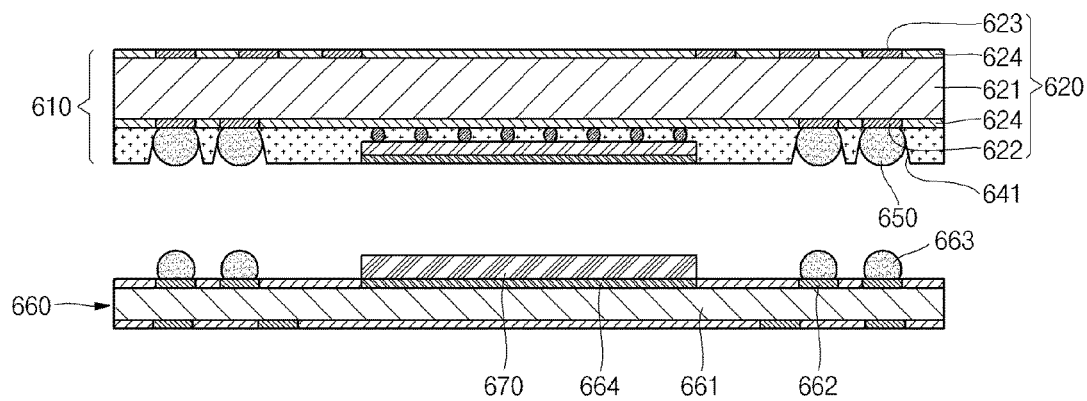
Figure 15D:
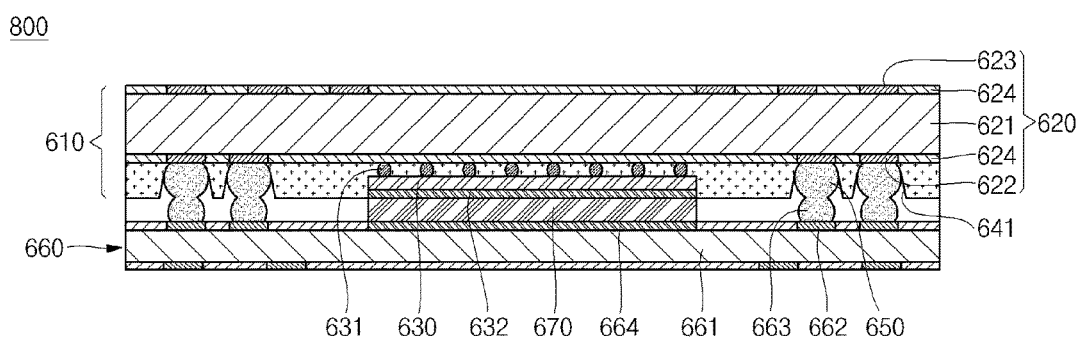

In the performing of the reflow process, as illustrated in FIG. 15C, a semiconductor device 610 is reversed and positioned such that the conductive structures 650 (e.g., conductive bumps or balls, pillars, wires, etc.) face the conductive structures 663 of the interposer 660, and the reflow process is performed on the semiconductor device 610, the semiconductor device 610 including a circuit board 620 having a first circuit pattern 622 formed on its top surface, a semiconductor die 630 mounted on a top surface of the circuit board 620 and having a metal layer 632 formed thereon, an encapsulant 640 encapsulating the semiconductor die 630 from an upper portion of the circuit board 620, and conductive structures 650 formed on the first circuit pattern 622 and penetrating (e.g., extending partly through, extending completely through, extending completely through and beyond, etc.) the encapsulant 640. Accordingly, as illustrated in FIG. 15D, the conductive structures 650 of the semiconductor device 610 are welded (or otherwise attached) to the conductive structures 663 of the interposer 660. In addition, the heat radiating member 670 is cured between the semiconductor device 610 and the interposer 660 and is electrically connected between the metal layer 632 and the conductive pad 664. Therefore, the heat radiating member 670 may transfer the heat generated from the semiconductor die 630 to the interposer 660 to then be transferred (e.g., radiated, conducted, convected, etc.) to the outside. According to the above-described fabricating method, the semiconductor package 800 according to various aspects of the present disclosure can be formed.

Alternatively, after the performing of the reflow process, the method of fabricating a semiconductor package according to still another example of the present disclosure may further include injecting an interlayer member in a space between the semiconductor device 610 and the interposer 660. In addition, the method of fabricating a semiconductor package according to still another example of the present disclosure may further include singulating (e.g., sawing, etc.) the panel type interposer 660, thereby forming a discrete semiconductor package 800.

Figure 16:
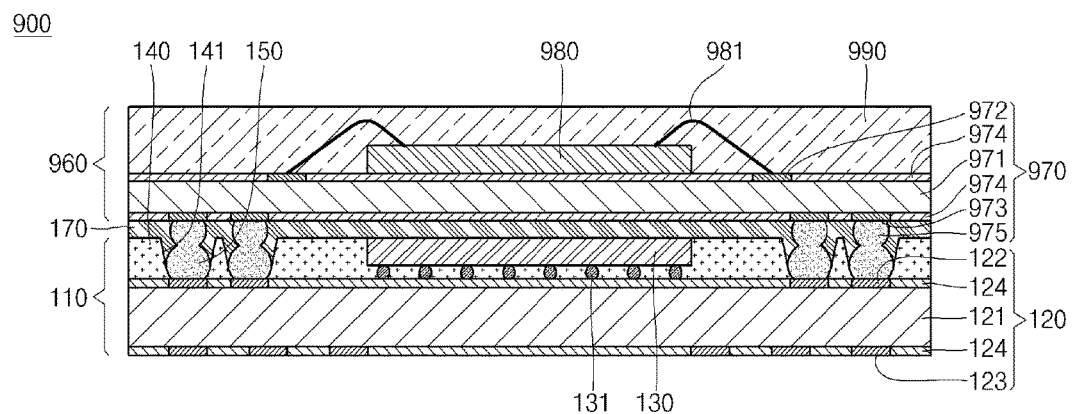
FIG. 16 is a cross-sectional view illustrating an example semiconductor package in accordance with various aspects of the present disclosure.

FIG. 16 is a cross-sectional view illustrating an example semiconductor package in accordance with various aspects of the present disclosure.

Referring to FIG. 16, the semiconductor package 900 according to still another example of the present disclosure includes a first semiconductor device 110, a second semiconductor device 960, and an interlayer member 170. For example, the semiconductor package 900 shown in FIG. 16 is different from the semiconductor package 100 shown in FIG. 1 in that the second semiconductor device 960, instead of the interposer 160, is provided. Accordingly, the following description will generally focus on only differences between the semiconductor packages 100 and 900. In addition, since the first semiconductor device 110 of the semiconductor package 900 shown in FIG. 16 is the same as the semiconductor device 110 of the semiconductor package 100 shown in FIG. 1, a detailed description thereof will not be given. Note that the example semiconductor package 900 may share any or all characteristics with any one or more other semiconductor packages discussed herein.

The second semiconductor device 960 is mounted on the first semiconductor device 110. The second semiconductor device 960 includes a circuit board 970, a semiconductor die 980 and an encapsulant 990.

The circuit board 970 includes an insulating layer 971 having planar top and bottom surfaces, a first circuit pattern 972 formed on a top surface of the insulating layer 971, a second circuit pattern 973 formed on a bottom surface of the insulating layer 971, and a passivation layer 974 formed along outer peripheral edges of the first and second circuit patterns 972 and 973 to a predetermined thickness. The circuit board 970 may, for example, comprise a double-sided printed circuit board (PCB). Here, conductive structures 975 (e.g., conductive bumps or balls, solder balls, pillars, wires, etc.) are welded (or otherwise attached) to the second circuit pattern 973. The conductive structures 975 are connected to a respective conductive structure 150 (e.g., a conductive bump or ball, pillar, wire, etc.) of the first semiconductor device 110, thereby electrically connecting the first semiconductor device 110 to the second semiconductor device 960.

The semiconductor die 980 is mounted on the circuit board 970. The semiconductor die 980 may, for example, be generally made of a silicon material and have a plurality of semiconductor devices formed therein. In addition, a plurality of bond pads (not shown) are formed on the semiconductor die 980 and a conductive wire 981 is connected to the bond pads. In addition, the conductive wire 981 is electrically connected to the first circuit pattern 972 of the circuit board 970. For example, the conductive wire 981 electrically connects the semiconductor die 980 to the circuit board 970.

The encapsulant 990 encapsulates the semiconductor die 980 and the conductive wire 981 from an upper portion of the circuit board 970.

The interlayer member 170 is formed between the first semiconductor device 110 and the second semiconductor device 960. For example, the interlayer member 170 is interposed between a top surface of the semiconductor die 130 of the first semiconductor device 110 and a bottom surface of the circuit board 970 of the second semiconductor device 960. In addition, the interlayer member 170 may be formed to cover the conductive structure 150 of the first semiconductor device 110 and lateral surfaces of the conductive structures 975 of the second semiconductor device 960. The interlayer member 170 may, for example, be formed of an epoxy flux or other material. In addition, the interlayer member 170 may be formed by injecting an epoxy resin, an epoxy molding compound (EMC), or other material into a space between the first semiconductor device 110 and the second semiconductor device 960. Further, the interlayer member 170 may also be formed of an anisotropically conductive paste (ACP).

Figure 17:
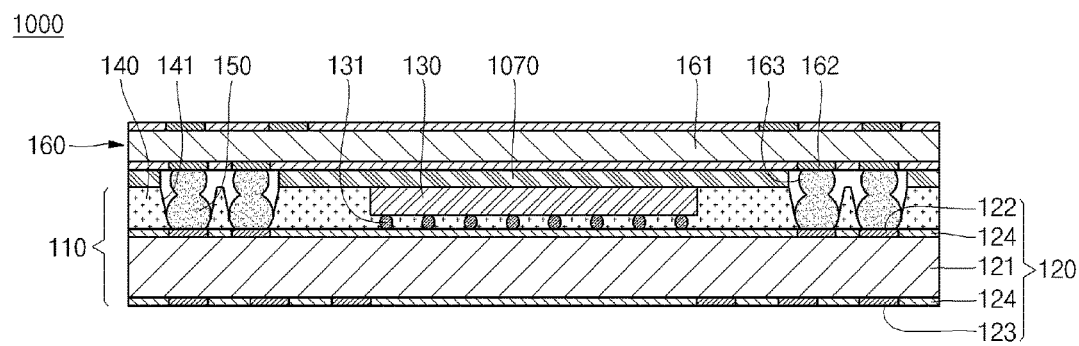
FIG. 17 is a cross-sectional view illustrating an example semiconductor package in accordance with various aspects of the present disclosure.

FIG. 17 is a cross-sectional view illustrating an example semiconductor package in accordance with various aspects of the present disclosure.

Referring to FIG. 17, the semiconductor package 1000 according to still another example of the present disclosure includes a semiconductor device 110, an interposer 160 and an interlayer member 1070. The semiconductor package 1000 shown in FIG. 17 is different from the semiconductor package 200 shown in FIG. 2 in that the first interlayer member part 271 is not provided. Accordingly, the following description will generally focus on only differences between the semiconductor packages 200 and 1000. Note that the example semiconductor package 1000 may share any or all characteristics with any one or more other semiconductor packages discussed herein.

The interlayer member 1070 is formed between the semiconductor device 110 and the interposer 160. For example, the interlayer member 1070 is formed between the semiconductor device 110 without the conductive structures 150 and conductive structures 163, and the interposer 160. For example, the interlayer member 1070 is formed between the semiconductor die 130 and the interposer 160 and between an encapsulant 140 and the interposer 160. In addition, the interlayer member 1070 may, for example, be formed of a general adhesive, such as an epoxy resin, an epoxy molding compound (EMC), etc. The interlayer member 1070 may transfer the heat generated from the semiconductor die 130 to the interposer 160 to then be transferred (e.g., radiated, conducted, convected, etc.) to the outside. In addition, the interlayer member 1070 may improve bondability between the semiconductor device 110 and the interposer 160.

Figure 18:
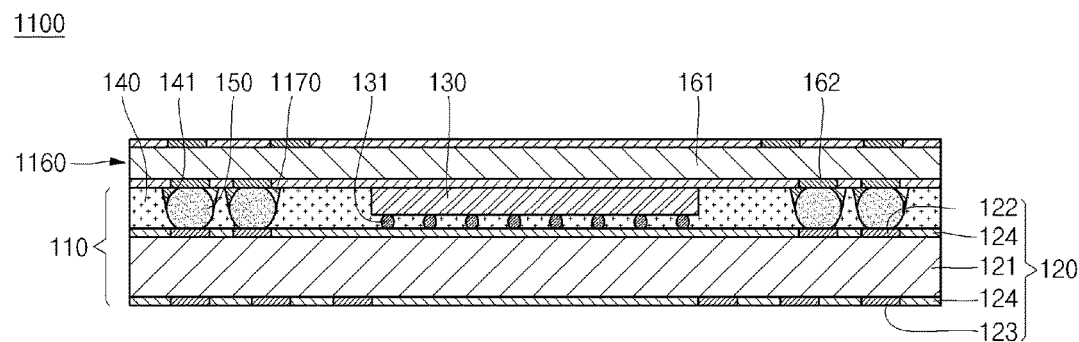
FIG. 18 is a cross-sectional view illustrating an example semiconductor package in accordance with various aspects of the present disclosure.

FIG. 18 is a cross-sectional view illustrating an example semiconductor package in accordance with various aspects of the present disclosure.

Referring to FIG. 18, the semiconductor package 1100 according to still another example of the present disclosure includes a semiconductor device 110, an interposer 1160, and an interlayer member 1170. The semiconductor package 1100 shown in FIG. 18 is substantially the same as the semiconductor package 100 shown in FIG. 1. Accordingly, the following description will generally focus on only differences between the semiconductor packages 100 and 1100. Note that the example semiconductor package 1100 may share any or all characteristics with any one or more other semiconductor packages discussed herein.

The interposer 1160 is mounted on the semiconductor device 110. The interposer 1160 includes an insulator 161 having planar top and bottom surfaces, and a circuit pattern 162 formed on a bottom surface of the insulator 161. In addition, the interposer 1160 may also include a circuit pattern formed on a top surface of the insulator 161 so as to stack semiconductor devices, such as memory chips or logic chips, thereon. The circuit pattern 162 formed on the bottom surface of the insulator 161 is electrically connected to the conductive structure 150 of the semiconductor device 110. For example, when the interposer 1160 is mounted on the semiconductor device 110, the conductive structure 150 is welded (or otherwise attached) to the circuit pattern 162 to electrically connect the interposer 1160 and the semiconductor device 110 to each other. Therefore, the bottom surface of the interposer 1160 may be brought into direct contact with a top surface of the semiconductor die 131. The interposer 1160 may, for example, comprise a silicon substrate, a printed circuit board (PCB), etc.

The interlayer member 1170 is formed between the semiconductor device 110 and the interposer 1160. For example, the interlayer member 1170 may be formed in a through via 141 of the encapsulant 140 to surround the conductive bump 150. The interlayer member 1170 may, for example, be formed of an epoxy flux or other material. The epoxy flux may, for example, be applied to surrounding areas of the conductive structure 150, thereby improving adhesion between the conductive structure 150 and the circuit pattern 162. In addition, the interlayer member 1170 may be formed by injecting an epoxy resin, an epoxy molding compound (EMC), or other material, into a portion between the semiconductor device 110 and the interposer 1160. Further, the interlayer member 1170 may also be formed of an anisotropically conductive paste (ACP).

In summary, various aspects of this disclosure provide a semiconductor device or package structure and a method for fabrication thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor package comprising:
    a semiconductor device comprising:
        a substrate comprising a first substrate surface, a second substrate surface opposite the first substrate surface, a plurality of side substrate surfaces between the first and second substrate surfaces, and a substrate circuit pattern on the first substrate surface;
        a semiconductor die mounted on the first substrate surface, the semiconductor die comprising a first die surface, a second die surface opposite the first die surface and facing the first substrate surface, and a plurality of side die surfaces between the first and second die surfaces; and
        an encapsulant comprising a first encapsulant surface and a second encapsulant surface opposite the first encapsulant surface and facing the substrate, where the encapsulant encapsulates at least the side die surfaces and at least a portion of the first substrate surface, and where the encapsulant comprises a through via that extends from the first encapsulant surface to the second encapsulant surface and exposes the substrate circuit pattern through the encapsulant;
    an interposer mounted on the semiconductor device and comprising a first interposer surface, a second interposer surface opposite the first interposer surface and facing the semiconductor device, and an interposer circuit pattern on the second interposer surface;
    one or more conductive structures that extend through the through via and electrically couple the interposer circuit pattern to the substrate circuit pattern; and
    an interlayer member between the semiconductor device and the interposer,
    wherein the interlayer member contacts and laterally surrounds an upper portion of the one or more conductive structures, and the encapsulant contacts and laterally surrounds a lower portion of the one or more conductive structures,
    wherein the one or more conductive structures comprise a first conductive structure connected to the substrate circuit pattern, wherein only a portion of the first conductive structure is laterally contacted and surrounded by the interlayer member, and a second conductive structure connected to the interposer circuit pattern, wherein the entire second conductive structure is laterally contacted and surrounded by the interlayer member.

2. The semiconductor package of claim 1, wherein the interlayer member comprises one or more of: an epoxy flux, an epoxy resin, an epoxy molding compound (EMC), and/or an anisotropically conductive paste (ACP).

3. A semiconductor package comprising:
    a semiconductor device comprising:
        a substrate comprising a first substrate surface, a second substrate surface opposite the first substrate surface, a plurality of side substrate surfaces between the first and second substrate surfaces, and a substrate circuit pattern on the first substrate surface;
        a semiconductor die mounted on the first substrate surface, the semiconductor die comprising a first die surface, a second die surface opposite the first die surface and facing the first substrate surface, and a plurality of side die surfaces between the first and second die surfaces; and
        an encapsulant comprising a first encapsulant surface and a second encapsulant surface opposite the first encapsulant surface and facing the substrate, where the encapsulant encapsulates at least the side die surfaces and at least a portion of the first substrate surface, and where the encapsulant comprises a through via that extends from the first encapsulant surface to the second encapsulant surface and exposes the substrate circuit pattern through the encapsulant;
    an interposer mounted on the semiconductor device and comprising a first interposer surface, a second interposer surface opposite the first interposer surface and facing the semiconductor device, and an interposer circuit pattern on the second interposer surface;
    one or more conductive structures that extend through the through via and electrically couple the interposer circuit pattern to the substrate circuit pattern; and
    an interlayer member between the semiconductor device and the interposer,
    wherein the interlayer member contacts and laterally surrounds an upper portion of the one or more conductive structures, and the encapsulant contacts and laterally surrounds a lower portion of the one or more conductive structures, and
    wherein the interlayer member comprises:
        a first interlayer member portion that covers the one or more conductive structures; and
        a second interlayer member portion, at least a portion of which is directly between the semiconductor die and the interposer, wherein the second interlayer member portion contacts the first interlayer member portion.

4. The semiconductor package of claim 3, wherein the second interlayer member portion directly contacts the first die surface.

5. The semiconductor package of claim 3, wherein:
the first interlayer member portion comprises a first interlayer member part made from a first type of material; and
the second interlayer member portion comprises a second interlayer member part made from a second type of material that is different from the first type of material.

6. The semiconductor package of claim 5, wherein the second type of material comprises an injection molding compound.

7. The semiconductor package of claim 3, wherein at least a second portion of the second interlayer member portion is directly between the encapsulant and the interposer.

8. The semiconductor package of claim 3, wherein a first end of the second interlayer member portion is positioned at a first side of the semiconductor package, and a second end of the second interlayer member portion is positioned at a second side of the semiconductor package.

9. The semiconductor package of claim 1, comprising a circuit pattern on the first interposer surface for coupling to a second semiconductor die.

10. The semiconductor package of claim 1, wherein the interposer comprises a silicon die.

11. A semiconductor package comprising:
a semiconductor device comprising:
a substrate comprising a first substrate surface, a second substrate surface opposite the first substrate surface, a plurality of side substrate surfaces between the first and second substrate surfaces, and a substrate circuit pattern on the first substrate surface;
a semiconductor die mounted on the first substrate surface, the semiconductor die comprising a first die surface, a second die surface opposite the first die surface and facing the first substrate surface, and a plurality of side die surfaces between the first and second die surfaces; and
an encapsulant comprising a first encapsulant surface and a second encapsulant surface opposite the first encapsulant surface and facing the substrate, where the encapsulant encapsulates at least the side die surfaces and at least a portion of the first substrate surface, and where the encapsulant comprises a through via that extends from the first encapsulant surface to the second encapsulant surface and exposes the substrate circuit pattern through the encapsulant;
an interposer mounted on the semiconductor device and comprising a first interposer surface, a second interposer surface opposite the first interposer surface and facing the semiconductor device, and an interposer circuit pattern on the second interposer surface;
one or more conductive structures that extend through the through via and electrically couple the interposer circuit pattern to the substrate circuit pattern; and
an interlayer member between the semiconductor device and the interposer, where the interlayer member comprises:
a first interlayer member portion of a first type of material that extends from the encapsulant to the interposer; and
a second interlayer member portion of a second type of material different from the first type of material, that extends from the semiconductor die to the interposer, wherein the first interlayer member portion contacts the second interlayer member portion.

12. The semiconductor package of claim 11, wherein the second type of material comprises an injection molding compound.

13. The semiconductor package of claim 11, wherein the first interlayer member portion contacts and laterally surrounds an upper portion of the one or more conductive structures but not a lower portion of the one or more conductive structures.

14. The semiconductor package of claim 11, wherein the second interlayer member portion is directly between the encapsulant and the interposer.

15. A semiconductor package comprising:
a semiconductor device comprising:
a substrate comprising a first substrate surface, a second substrate surface opposite the first substrate surface, a plurality of side substrate surfaces between the first and second substrate surfaces, and a substrate circuit pattern on the first substrate surface;
a semiconductor die mounted on the first substrate surface, the semiconductor die comprising a first die surface, a second die surface opposite the first die surface and facing the first substrate surface, and a plurality of side die surfaces between the first and second die surfaces; and
an encapsulant comprising a first encapsulant surface, a second encapsulant surface opposite the first encapsulant surface and facing the substrate, and a plurality of side encapsulant surfaces between the first and second encapsulant surfaces, where the encapsulant encapsulates at least the side die surfaces and at least a portion of the first substrate surface, and where the encapsulant comprises a through via that extends from the first encapsulant surface to the second encapsulant surface and exposes the substrate circuit pattern through the encapsulant;
an interposer mounted on the semiconductor device and comprising a first interposer surface, a second interposer surface opposite the first interposer surface and facing the semiconductor device, and an interposer circuit pattern formed on the second interposer surface;
one or more conductive structures that extend through the through via and electrically couple the interposer circuit pattern to the substrate circuit pattern; and
an interlayer member between the semiconductor device and the interposer, wherein the interlayer member comprises a first material that extends to a first side of the semiconductor package and to a second side of the semiconductor package, the first material comprising a first side that is coplanar with the first side of the semiconductor package and a second side that is coplanar with the second side of the semiconductor package, wherein:
the interlayer member comprises a second material, different from the first material, that contacts and laterally surrounds an upper portion of the one or more conductive structures; and
the encapsulant contacts and laterally surrounds a lower portion of the one or more conductive structures.

16. The semiconductor package of claim 15, wherein the first material covers the semiconductor die and the encapsulant.

17. The semiconductor package of claim 15, wherein the interlayer member contacts and laterally surrounds an upper portion of the one or more conductive structures but not a lower portion of the one or more conductive structures.

18. The semiconductor package of claim 15, wherein the first material contacts the second material.

* * * * *